US011362223B2

(12) United States Patent
Chen et al.

(10) Patent No.: US 11,362,223 B2
(45) Date of Patent: Jun. 14, 2022

(54) METHOD FOR MANUFACTURING AN OPTICAL SENSOR

(71) Applicant: PERSONAL GENOMICS, INC., Grand Cayman (KY)

(72) Inventors: Coming Chen, Taoyuan (TW); Teng-Chien Yu, Hsinchu (TW); Yuan-Che Lee, Taichung (TW)

(73) Assignee: PERSONAL GENOMICS, INC., Grand Cayman (KY)

( * ) Notice: Subject to any disclaimer, the term of this patent is extended or adjusted under 35 U.S.C. 154(b) by 170 days.

(21) Appl. No.: 16/665,352

(22) Filed: Oct. 28, 2019

(65) Prior Publication Data

US 2020/0066926 A1    Feb. 27, 2020

Related U.S. Application Data

(63) Continuation of application No. 14/996,037, filed on Jan. 14, 2016, now abandoned.
(Continued)

(51) Int. Cl.
*H01L 31/0232* (2014.01)
*G01N 21/77* (2006.01)
(Continued)

(52) U.S. Cl.
CPC ... *H01L 31/02327* (2013.01); *G01N 21/0303* (2013.01); *G01N 21/648* (2013.01);
(Continued)

(58) Field of Classification Search
None
See application file for complete search history.

(56) References Cited

U.S. PATENT DOCUMENTS 6,197,503 B1  3/2001  Vo-Dinh et al.
6,861,686 B2 *  3/2005  Lee ............... H01L 27/14636
                                            257/292
(Continued)

FOREIGN PATENT DOCUMENTS

EP       2012114        1/2009
JP       2001267544     9/2001
WO       2014130900 A1  8/2014

OTHER PUBLICATIONS

Non-final Office Action of EP family patent Application No. 18151201.7, dated Nov. 23, 2020.
(Continued)

*Primary Examiner* — Nishath Yasmeen
(74) *Attorney, Agent, or Firm* — Muncy, Geissler, Olds & Lowe, P.C.

(57) ABSTRACT

A method for manufacturing an optical sensor is provided. The operations of the method for manufacturing the optical sensor includes providing a semiconductive layer having an electrical circuit area and an optical sensing area; forming a first electrical contact directly over the electrical circuit area; forming a first light guiding part directly over the optical sensing area simultaneously with forming the first electrical contact; forming a first metal layer directly over the first electrical contact; forming a second light guiding part directly over the first light guiding part simultaneously with forming a second electrical contact directly over the first electrical contact; forming a thick metal layer over the electrical circuit area and an optical sensing area; and forming an aperture in the thick metal layer, wherein the aperture aligning with the optical sensing area.

5 Claims, 28 Drawing Sheets

Related U.S. Application Data

(60) Provisional application No. 62/104,340, filed on Jan. 16, 2015.

(51) Int. Cl.
    *G01N 21/64*     (2006.01)
    *G01N 21/03*     (2006.01)
    *H01L 31/02*     (2006.01)
    *G02B 6/42*     (2006.01)

(52) U.S. Cl.
CPC ... *G01N 21/7703* (2013.01); *H01L 31/02005* (2013.01); *G01N 21/6454* (2013.01); *G01N 2021/7753* (2013.01); *G01N 2021/7786* (2013.01); *G01N 2201/0642* (2013.01); *G02B 6/4214* (2013.01)

(56) References Cited

U.S. PATENT DOCUMENTS

| | | |
|---|---|---|
| 2002/0163023 A1 | 11/2002 | Miida |
| 2005/0285215 A1* | 12/2005 | Lee .................. H01L 27/14623 257/432 |
| 2006/0113622 A1* | 6/2006 | Adkisson .......... H01L 27/14685 257/E21.582 |
| 2006/0115230 A1* | 6/2006 | Komoguchi ...... H01L 27/14601 385/146 |
| 2006/0214086 A1 | 9/2006 | Fukushima |
| 2007/0023799 A1* | 2/2007 | Boettiger .......... H01L 27/14625 257/292 |
| 2008/0036023 A1* | 2/2008 | Park .................. H01L 27/14685 257/E31.127 |
| 2008/0111159 A1 | 5/2008 | Gambino et al. |
| 2008/0251874 A1* | 10/2008 | Ishibe .............. H01L 27/14645 257/E31.127 |
| 2009/0166514 A1* | 7/2009 | Tokuda .............. G01N 27/3275 257/E31.124 |
| 2009/0251573 A1 | 10/2009 | Toyoda |
| 2011/0042701 A1 | 2/2011 | Du Plessis et al. |
| 2011/0175187 A1 | 7/2011 | Ueno et al. |
| 2011/0223590 A1 | 9/2011 | Chiou et al. |
| 2012/0021525 A1 | 1/2012 | Fehr et al. |
| 2012/0156100 A1 | 6/2012 | Tsai et al. |

OTHER PUBLICATIONS

A Non-final Office Action of EP family patent Application No. 16151201.7, dated Mar. 2, 2022, 17 pages.

* cited by examiner

METHOD FOR MANUFACTURING AN OPTICAL SENSOR

PRIORITY CLAIM AND CROSS REFERENCE

This application is a continuation of U.S. application Ser. No. 14/996,037, filed on Jan. 14, 2016, and claims priority to a U.S. Provisional Application No. 62/104,340, filed on Jan. 16, 2015. All of the above-referenced applications are hereby incorporated herein by reference in their entirety.

FIELD

The present disclosure relates to an optical sensor with a light-guiding feature and a method for preparing the same.

BACKGROUND

Optical sensors are widely used in various imaging applications and products, such as cameras, scanners, photocopiers and the like. Optical sensors used in various fields of technology are designed for different purposes.

To improve performance and reduce size of optical sensors, various designs for optical sensors are employed. One way to evaluate the performance is by measuring the quantum efficiency of an optical sensor. Quantum efficiency is a percentage of photons hitting the optical sensor that produce charge carriers. It is a measurement of the optical sensor's electrical sensitivity to light.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY

One aspect of the present disclosure provides an optical sensor with a light-guiding feature and a method for preparing the same.

An optical sensor, according to this aspect of the present disclosure, comprises a semiconductive layer comprising an electrical circuit area and an optical sensing area, a sample-holding portion over the optical sensing area, a light-guiding structure between the sample-holding portion and the optical sensing area, and an electrical interconnect structure over the electrical circuit area, wherein the electrical interconnect structure is integrally formed with the light-guiding structure, and the light-guiding structure is configured to direct an emitting light from the sample-holding portion to the optical sensing area.

In some embodiments, the electrical interconnect structure comprises at least one electrical contact over the electrical circuit area, and the light-guiding structure comprises at least one first light-guiding part over the optical sensing area.

In some embodiments, the semiconductive layer has a horizontal upper surface, and the at least one electrical contact and the at least one first light-guiding part extend substantially in a same horizontal plane, which is in parallel to and above the horizontal upper surface.

In some embodiments, the light-guiding structure comprises a plurality of first light-guiding parts arranged in a ring.

In some embodiments, the at least one first light-guiding part is a ring-shaped part.

In some embodiments, the electrical interconnect structure comprises at least one electrical via over the at least one electrical contact, and the light-guiding structure comprises at least one second light-guiding part over the at least one first light-guiding part.

In some embodiments, the semiconductive layer has a horizontal upper surface, and the at least one electrical via and the at least one second light-guiding part extend substantially in a same horizontal plane, which is in parallel to and above the horizontal upper surface.

In some embodiments, the light-guiding structure comprises a plurality of second light-guiding parts arranged in a ring.

In some embodiments, the at least one second light-guiding part is a ring-shaped part.

In some embodiments, the light-guiding structure extends from a horizontal upper surface of the semiconductive layer.

In some embodiments, the light-guiding structure comprises an inner light-guiding bar in a first layer over the semiconductive layer and an outer light-guiding bar in a second layer over the semiconductive layer.

In some embodiments, a width of the light-guiding structure is larger in an upper region close to the sample-holding portion than that in a bottom region close to the light-sensing region.

In some embodiments, a width of the light-guiding structure is larger in a bottom region close to the light-sensing region than that in the upper region close to the sample-holding portion.

An optical sensor, according to another aspect of the present disclosure, comprises a semiconductive layer comprising an electrical circuit area and an optical sensing area, a sample-holding portion over the optical sensing area, at least one electrical contact over the electrical circuit area, and at least one first light-guiding part configured to direct an emitting light from the sample-holding portion to the optical sensing area, wherein the semiconductive layer has a horizontal upper surface, the at least one first light-guiding part is between the sample-holding portion and the optical sensing area, and the at least one electrical contact and the at least one first light-guiding part extend substantially in a same horizontal plane, which is in parallel to and above the horizontal upper surface.

In some embodiments, the at least one electrical contact is integrally formed with the at least one first light-guiding part.

An optical sensor, according to another aspect of the present disclosure, comprises a semiconductive layer comprising an optical sensing area, a sample-holding portion over the optical sensing area, and a light-guiding structure configured to direct an emitting light from the sample-holding portion to the optical sensing area, wherein the light-guiding structure comprises at least one light-guiding spacer extending from a horizontal upper surface of the semiconductive layer, and the light-guiding structure has a tapering top end near the sample-holding portion.

In some embodiments, the light-guiding structure comprises a plurality of light-guiding spacers arranged in a ring.

In some embodiments, the light-guiding structure comprises a ring-shaped guiding spacer.

In some embodiments, the optical sensor comprises a plurality of dielectric layers over the optical sensing area, wherein the at least one light-guiding spacer extends through the plurality of dielectric layers.

In some embodiments, the light-guiding structure has a sidewall tilted with respect to the semiconductive layer, and an included angle between the horizontal upper surface of the semiconductive layer and the sidewall is about 60 degrees to 89.5 degrees.

The light-guiding structure is designed to prevent light scattering. Due to the design of the light-guiding structure, the emitting light from the sample-holding portion can be more efficiently directed to the light-sensing region in the optical sensing area. Furthermore, the fabrication of the light-guiding structure complies with the back-end-of-line (BEOL) metallization technology and can be fabricated by the same fabrication process in the same die as the electrical interconnected structure and the multi junction photodiode of the light-sensing region. In addition, the light-guiding structure, the electrical interconnect structure and the multi junction photodiode of the light-sensing region are integrated in the same die by the same fabrication process rather than in two separated devices. Thus, the size of the optical sensor can be dramatically decreased.

The foregoing has outlined rather broadly the features and technical advantages of the present disclosure in order that the detailed description of the disclosure that follows may be better understood. Additional features and advantages of the disclosure will be described hereinafter, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to an optical sensor with a light-guiding feature. In order to make the present disclosure completely comprehensible, detailed steps and structures are provided in the following description. Obviously, implementation of the present disclosure does not limit special details known by persons skilled in the art. In addition, known structures and steps are not described in detail, so as not to limit the present disclosure unnecessarily. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1A:
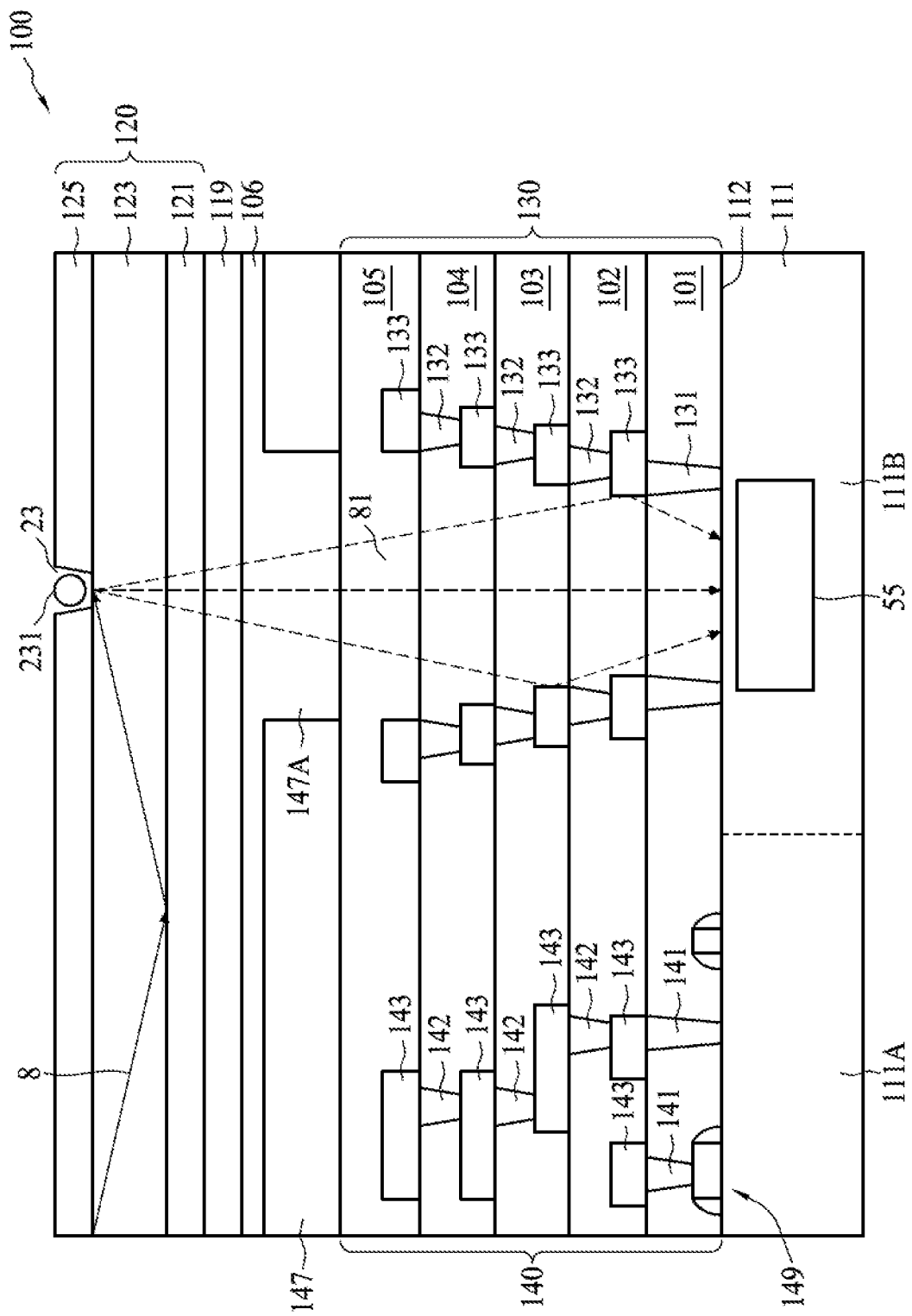
FIG. 1A is a cross-sectional view of an optical sensor in accordance with some embodiments of the present disclosure.

FIG. 1A is a cross-sectional view of an optical sensor 100 in accordance with some embodiments of the present disclosure. In some embodiments, the optical sensor 100 comprises a semiconductive layer 111 having an electrical circuit area 111A and an optical sensing area 111B, a sample-holding portion 23 over the optical sensing area 111B, a light-guiding structure 130 between the sample-holding portion 23 and the optical sensing area 111B, and an electrical interconnect structure 140 over the electrical circuit area 111A. In some embodiments, the light-guiding structure 130 is configured to direct an emitting light from the sample-holding portion 23 to the optical sensing area 111B.

In some embodiments, the semiconductive layer 111 is a silicon substrate including a light-sensing region 55 in the optical sensing area 111B used for detecting light of various wavelengths, and the sample holding portion 23 is used for holding a specimen 231 under analysis. In some embodiments, the sample holding portion 23 is disposed in a waveguide structure 120 over the light-guiding structure 130, and the light-sensing region 55 is a multi junction photodiode disposed in an epitaxy region below the light-guiding structure 130. In some embodiments, the light-sensing region 55 in the semiconductive layer 111 and the sample holding portion 23 in a waveguide structure 120 are disclosed in U.S. patent application Ser. No. 14/695,675, and the entire content of which is incorporated herein for all purposes by this reference.

When a light 8 having wavelengths from around 450 nanometers to around 500 nanometers shines on the specimen 231 in the sample holding portion 23, the specimen 231 emits lights 81 such as fluorescent lights, and the light-guiding structure 130 is configured to direct the emitting lights 81 to the light-sensing region 55. The wavelength of the emitted fluorescent light, for example, can be a characteristic of a material in the specimen 231. For example, in some embodiments, the specimen 231 emits fluorescent lights with different wavelengths. In some embodiments, the light-sensing region 55 is electrically connected to the electrical interconnect structure 140 through conductor so as to transfer the charge carriers generated in the light sensing region 55 to the electrical circuitry in the electrical interconnect structure 140 for further signal processing and/or output to signal-processing electronics, such as a DSP or microprocessor.

In some embodiments, the electrical interconnect structure 140 is integrally formed with the light-guiding structure 130. In some embodiments, the correspondingly elements of the electrical interconnect structure 140 and the light-guiding structure 130 are formed substantially by the same fabrication process, and have substantially the same physical and chemical properties.

In some embodiments, the electrical interconnect structure 140 comprises at least one electrical contact 141 over the electrical circuit area 111A, and the light-guiding structure 130 comprises at least one first light-guiding part 131 over the optical sensing area 111B. In some embodiments, the first light-guiding part 131 is simultaneously formed with the electrical contact 141 substantially by the same fabrication process and the same material, and the first light-guiding part 131 and the electrical interconnect contact 141 have substantially the same physical and chemical properties.

In some embodiments, the semiconductive layer 111 has a horizontal upper surface 112, and the electrical contact 141 and the first light-guiding part 131 extend substantially in a same horizontal plane, which is in parallel to and above the horizontal upper surface 112. In some embodiments, the optical sensor 100 has a dielectric layer 101 over the horizontal upper surface 112, and the electrical contact 141 and the first light-guiding part 131 are positioned in the dielectric layer 101. In some embodiments, the bottom ends of the electrical contact 141 and the first light-guiding part 131 are substantially at the same level, the upper ends of the electrical contact 141 and the first light-guiding part 131 are substantially at the same level; thus, the electrical contact 141 and the first light-guiding part 131 can be formed through the same fabrication process.

In some embodiments, the electrical interconnect structure 140 comprises at least one electrical via 142 over the electrical contact 141, and the light-guiding structure 130 comprises at least one second light-guiding part 132 over the first light-guiding part 131. In some embodiments, the second light-guiding part 132 is simultaneously formed with the electrical via 142 substantially by the same fabrication process and the same material, and the second light-guiding part 132 and the electrical via 142 have substantially the same physical and chemical properties.

In some embodiments, the electrical interconnect structure 140 has an electrical metal layer 143 between the electrical via 142 and the electrical contact 141; similarly, the light-guiding structure 130 has a third light-guiding part 133 between the second light-guiding part 132 and the first light-guiding part 131. In some embodiments, the third light-guiding part 133 is simultaneously formed with the electrical metal layer 143 substantially by the same fabrication process and the same material, and the third light-guiding part 133 and the electrical metal layer 143 have substantially the same physical and chemical properties.

In some embodiments, the electrical via 142 and the second light-guiding part 132 extend substantially in a same horizontal plane, which is in parallel to and above the horizontal upper surface 112. In some embodiments, the optical sensor 100 has a dielectric layer 102 over the horizontal upper surface 112, and the electrical via 142 and the second light-guiding part 132 are positioned in the dielectric layer 102. In some embodiments, the bottom ends of the electrical metal layer 143 and the third light-guiding part 133 are substantially at the same level, the upper ends of the electrical via 142 and the second light-guiding part 132 are substantially at the same level; thus, the electrical contact 141 and the first light-guiding part 131 can be formed through the same fabrication processes.

In some embodiments, the optical sensor 100 has a plurality of dielectric layers 102-104 over the dielectric layer 101, and each dielectric layer has at least one electrical via 142 and at least one second light-guiding part 132 extending substantially in a same horizontal plane. In some embodiments, the second light-guiding part 132 can be optionally implemented in some of the dielectric layers, rather than in all of the dielectric layers. In some embodiments, the light-guiding structure 130 extends vertically or in a tilt manner from the horizontal upper surface 112 of the semiconductive layer 111. In some embodiments, the horizontal distance between the second light-guiding parts 132 in the upper dielectric layer 104 is larger than that in the lower dielectric layer 102; in other words, the horizontal distance shrinks along a light-propagating direction from the sample-holding portion 23 to the light-sensing region 55.

Figure 1B:
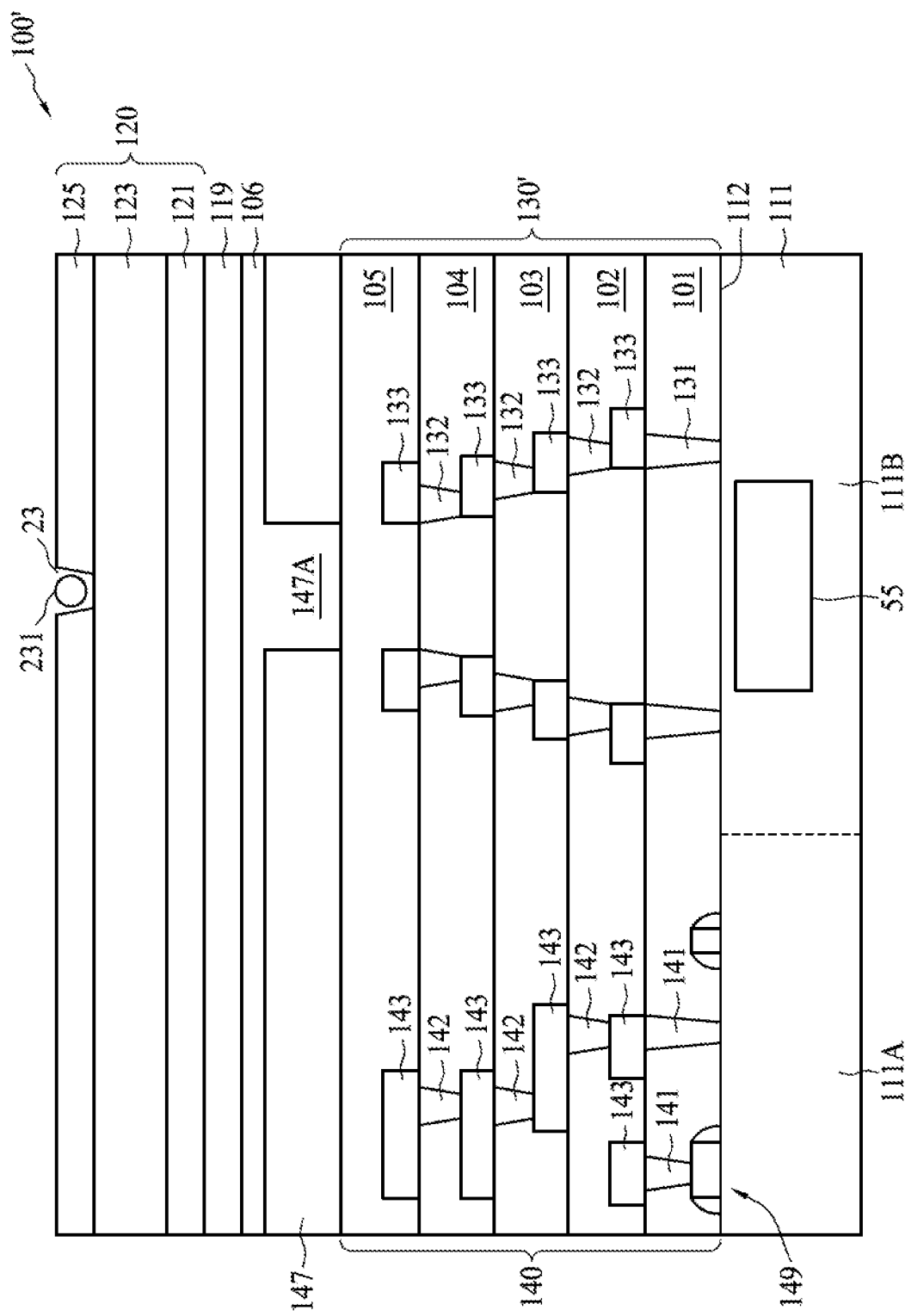
FIG. 1B is a cross-sectional view of an optical sensor in accordance with some embodiments of the present disclosure.

FIG. 1B is a cross-sectional view of an optical sensor 100' in accordance with some embodiments of the present disclosure. The optical sensor 100' shown in FIG. 1B is substantially the same as the optical sensor 100 shown in FIG. 1A, except the design of the light-guiding structure. In FIG. 1A, the width of the light-guiding structure 130 is larger in the upper region (close to the sample-holding portion 23) than that in the bottom region (close to the light-sensing region 55); in contrast, in FIG. 1B, the width of the light-guiding structure 130' is larger in the bottom region (close to the light-sensing region 55) than that in the upper region (close to the sample-holding portion 23).

Figure 1C:
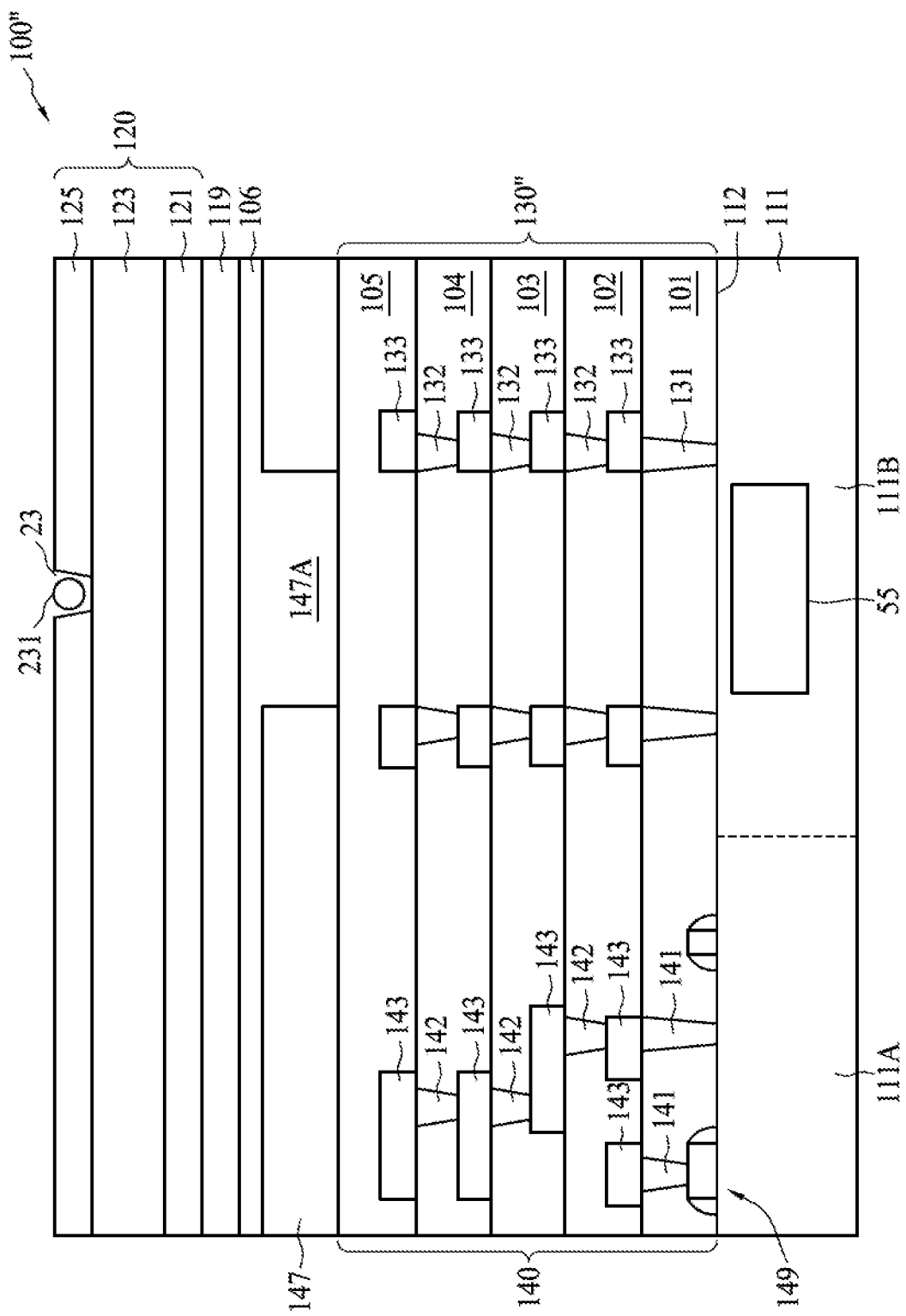
FIG. 1C is a cross-sectional view of an optical sensor in accordance with some embodiments of the present disclosure

FIG. 1C is a cross-sectional view of an optical sensor 100" in accordance with some embodiments of the present disclosure. The optical sensor 100" shown in FIG. 1C is substantially the same as the optical sensor 100 shown in FIG. 1A, except the design of the light-guiding structure. In FIG. 1A, the width of the light-guiding structure 130 is larger in the upper region (close to the sample-holding portion 23) than that in the bottom region (close to the light-sensing region 55); in contrast, in FIG. 1C, the width of the light-guiding structure 130″ in the bottom region (close to the light-sensing region 55) is substantially the same as that in the upper region (close to the sample-holding portion 23). In other words, the inner sidewall of the light-guiding structure 130″ is substantially vertical to the horizontal upper surface 112.

Figure 2:
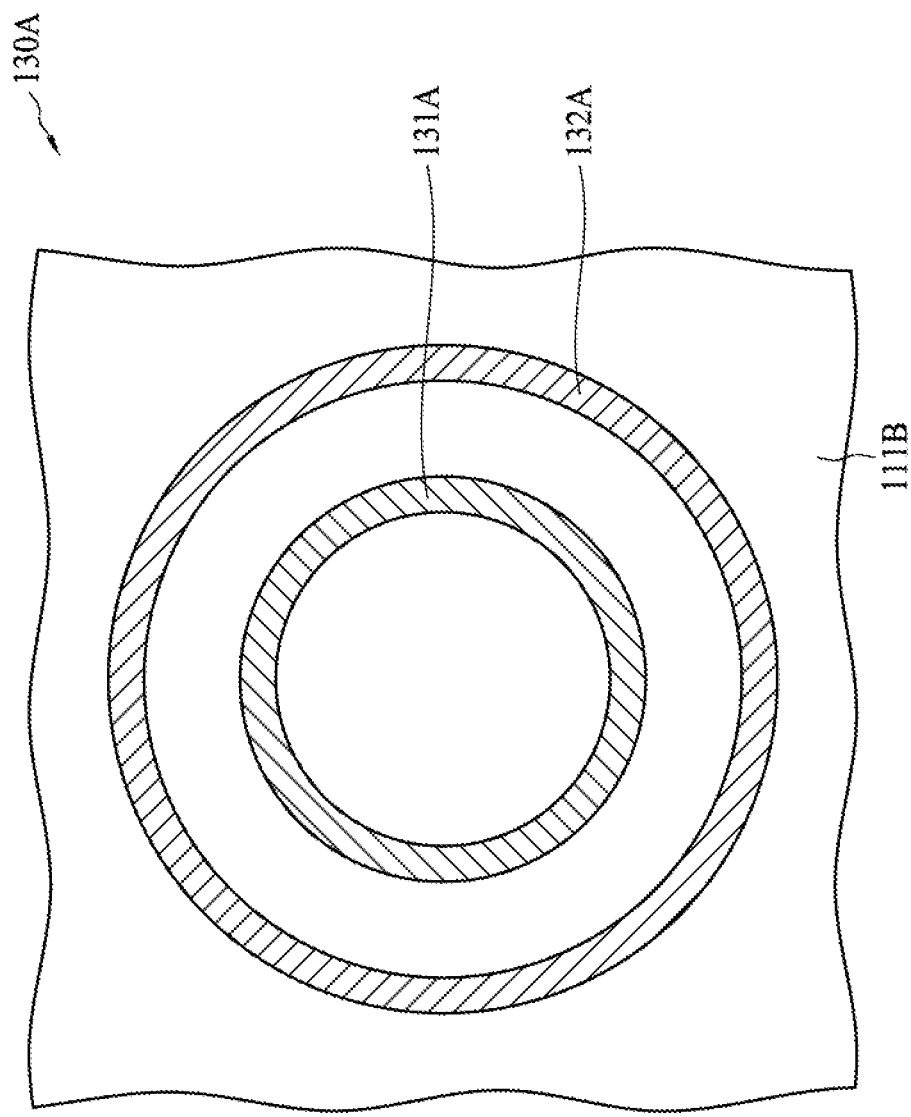
FIG. 2 is a top view of a light-guiding structure in accordance with some embodiments of the present disclosure.

FIG. 2 is a top view of a light-guiding structure 130A in accordance with some embodiments of the present disclosure. In some embodiments, the light-guiding structure 130A comprises a ring-shaped first light-guiding part 131A and a ring-shaped second light-guiding part 132A. In some embodiments, the ring-shaped first light-guiding part 131A can be optionally disposed inside or outside of the ring-shaped second light-guiding part 132A, and more second light-guiding parts can be optionally disposed in the light-guiding structure 130A. In some embodiments, the outer periphery of the ring-shaped first light-guiding part 131A can be optionally overlapped with the inner periphery of the ring-shaped second light-guiding part 132A where the ring-shaped first light-guiding part 131A is disposed inside the ring-shaped second light-guiding part 132A, or vice versa.

Figure 3:
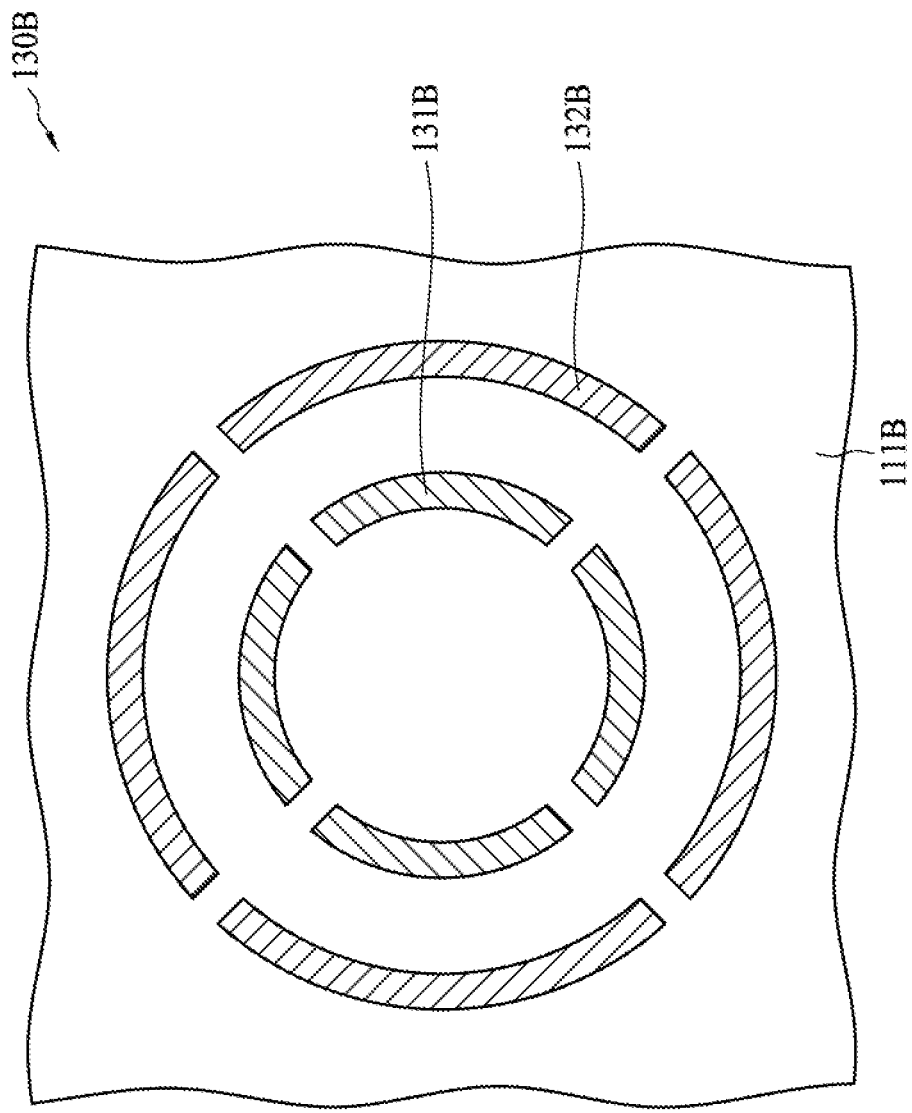
FIG. 3 is a top view of a light-guiding structure in accordance with some embodiments of the present disclosure.

FIG. 3 is a top view of a light-guiding structure 130B in accordance with some embodiments of the present disclosure. In some embodiments, the light-guiding structure 130B comprises a plurality of first light-guiding parts 131B arranged in a ring, and a plurality of second light-guiding parts 132B arranged in a ring. In some embodiments, the plurality of first light-guiding part 131B can be optionally disposed inside or outside of the plurality of second light-guiding parts 132B, and more second light-guiding parts can be optionally disposed in the light-guiding structure 130B. In some embodiments, the outer periphery of the first light-guiding part 131B can be optionally overlapped with the inner periphery of the second light-guiding part 132B where the first light-guiding part 131B is disposed inside the second light-guiding part 132B, or vice versa.

Figure 4:
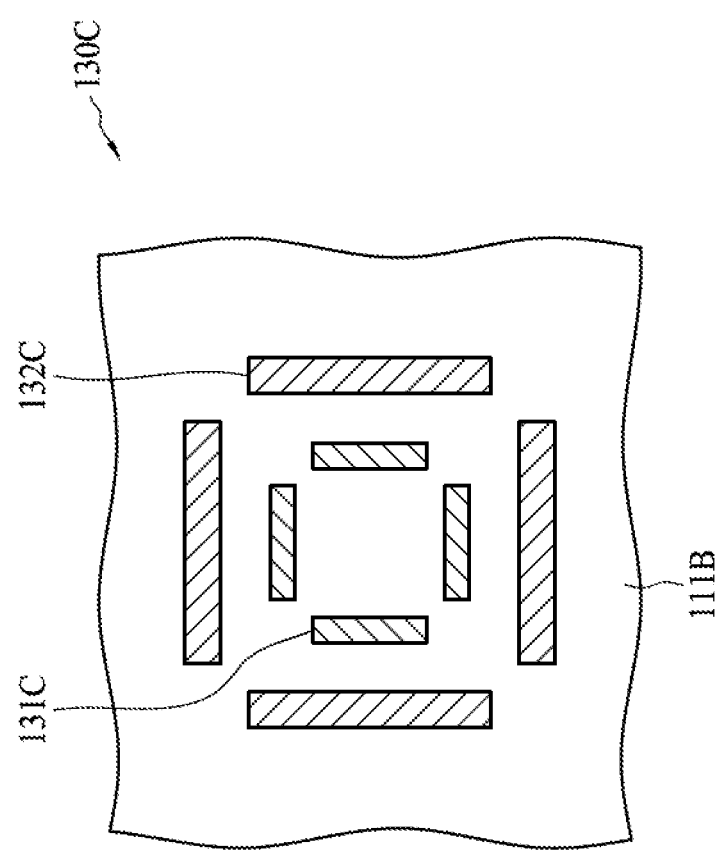
FIG. 4 is a top view of a light-guiding structure in accordance with some embodiments of the present disclosure.

FIG. 4 is a top view of a light-guiding structure 130C in accordance with some embodiments of the present disclosure. In some embodiments, the light-guiding structure 130C comprises an inner light-guiding bar 131C serving as the first light-guiding part in the dielectric layer 101 over the semiconductive layer 111 and an outer light-guiding bar 132C serving as the second light-guiding part in the dielectric layer 102 over the semiconductive layer 111. In some embodiments, the light-guiding bar 131C can be optionally disposed inside or outside of the light-guiding bar 132C, and more light-guiding bars can be optionally disposed in the light-guiding structure 130C. In some embodiments, the outer periphery of the inner light-guiding bar can be optionally overlapped with the inner periphery of the outer light-guiding bar. In some embodiments, each of the light-guiding bars 131C can be further laterally divided into several parts; similarly, each of the light-guiding bars 132C can be further laterally divided into several parts. In some embodiments, the light-guiding bars 131C can be optionally connected to form an integral rectangular light-guiding ring, and the light-guiding bars 132C can be optionally connected to form an integral rectangular light-guiding ring.

Due to the design purpose of the light-guiding structure 130 to prevent light scattering, the emitting light 81 from the sample-holding portion 23 can be more efficiently directed to the light-sensing region 55 in the optical sensing area 111B. Furthermore, the fabrication of the light-guiding structure 130, the electrical interconnect structure 140, and the multi junction photodiode of the light-sensing region 55 comply with the back-end-of-line (BEOL) metallization technology, and can be fabricated by the same fabrication process in the same die. In addition, the light-guiding structure 130, the electrical interconnect structure 140, and the multi junction photodiode of the light-sensing region are integrated in the same die by the same fabrication process rather than in two separated devices. Thus, the size of the optical sensor 100 can be dramatically decreased.

FIG. 5 to FIG. 10 are cross-sectional views for preparing an optical sensor in accordance with some embodiments of the present disclosure. In some embodiments, the fabrication processes disclosed in FIG. 5 to FIG. 10 comply with the aluminum back-end-of-line (BEOL) metallization technology.

Figure 5:
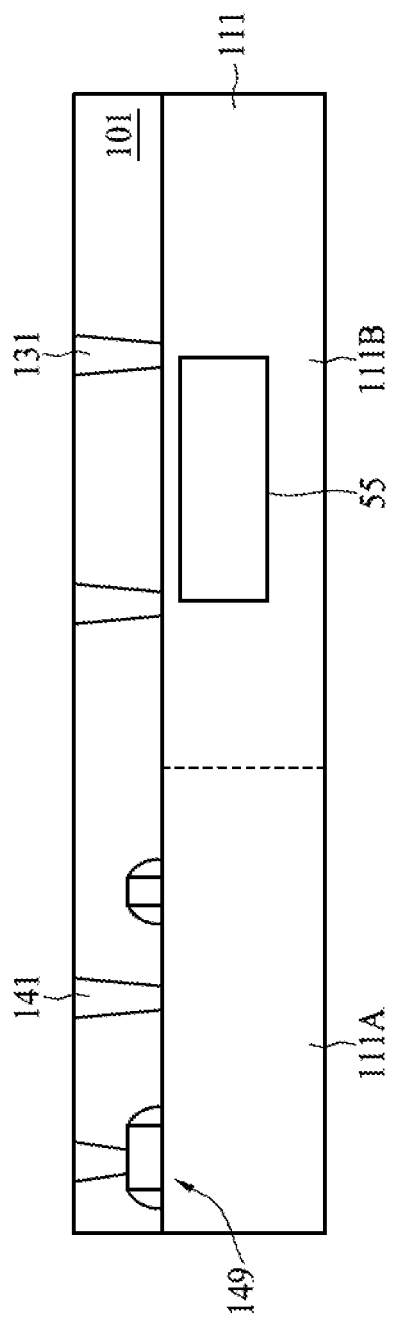
FIG. 5 to FIG. 10 are cross-sectional views for preparing an optical sensor in accordance with some embodiments of the present disclosure.

Referring to FIG. 5, in some embodiments, a light-sensing region 55 is formed in a semiconductive layer 111, electronic devices 149 such as transistors are formed over an electrical circuit area 111A, and an inter-layer dielectric layer 101 is then formed on the semiconductive layer 111 by deposition and planarization processes. Subsequently, lithographic, etching, deposition and planarization processes are performed to form electrical contacts 141 over the electrical circuit area 111A and form first light-guiding parts 131 over the optical sensing area 111B. In some embodiments, the electrical contact 141 and the first light-guiding part 131 include tungsten (W).

Figure 6:
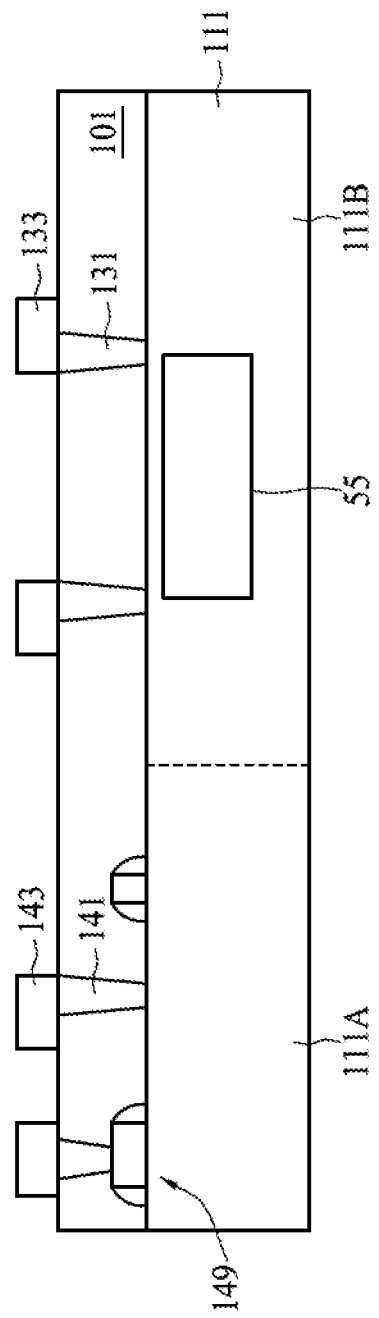

Referring to FIG. 6, deposition, lithographic and etching processes are performed to form an electrical metal layer 143 over the electrical contact 141 and form a third light-guiding part 133 over the first light-guiding part 131. In some embodiments, the electrical metal layer 143 and the third light-guiding part 133 include aluminum (Al).

Figure 7:
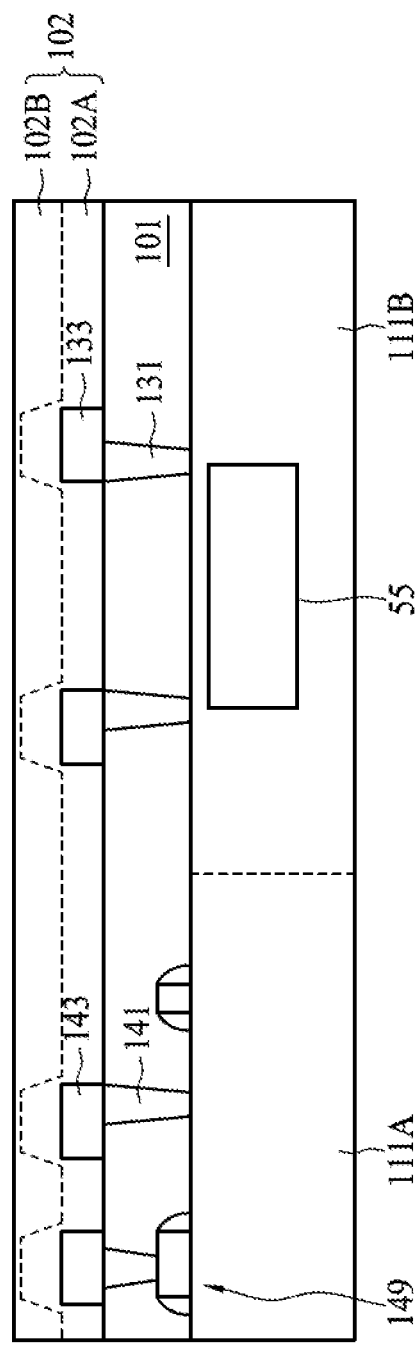

Referring to FIG. 7, an inter-metal dielectric layer 102 is formed on the inter-layer dielectric layer 101 by deposition and planarization processes. In some embodiments, the inter-metal dielectric layer 102 includes a lower portion 102A formed by an HDP deposition process and an upper layer 102B formed by a PECVD process.

Figure 8:
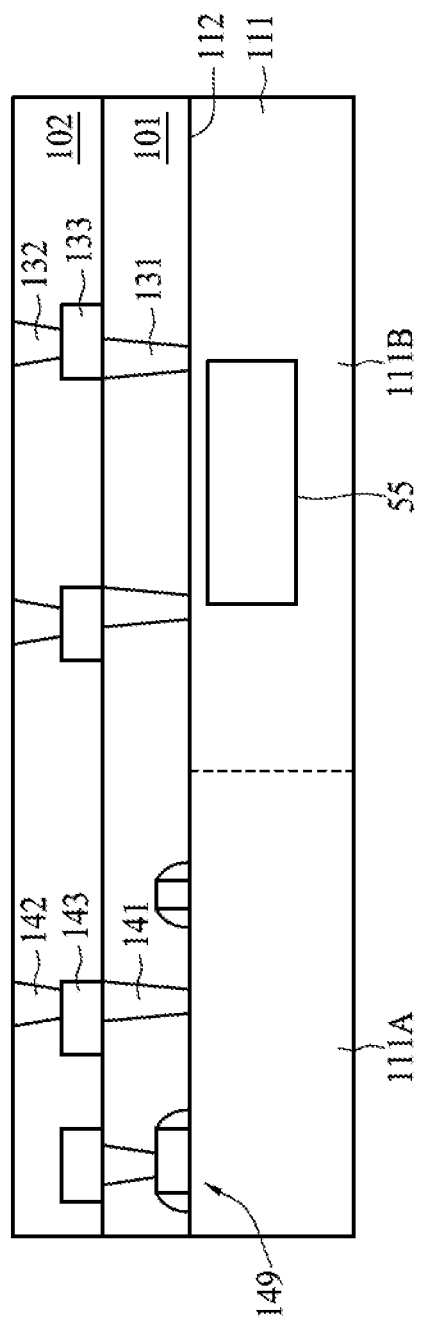

Referring to FIG. 8, lithographic, etching, deposition and planarization processes are performed to form electrical vias 142 over the electrical contacts 141 and form second light-guiding parts 132 over the first light-guiding parts 131. In some embodiments, the electrical via 142 and the second light-guiding part 132 include tungsten (W).

Figure 9:
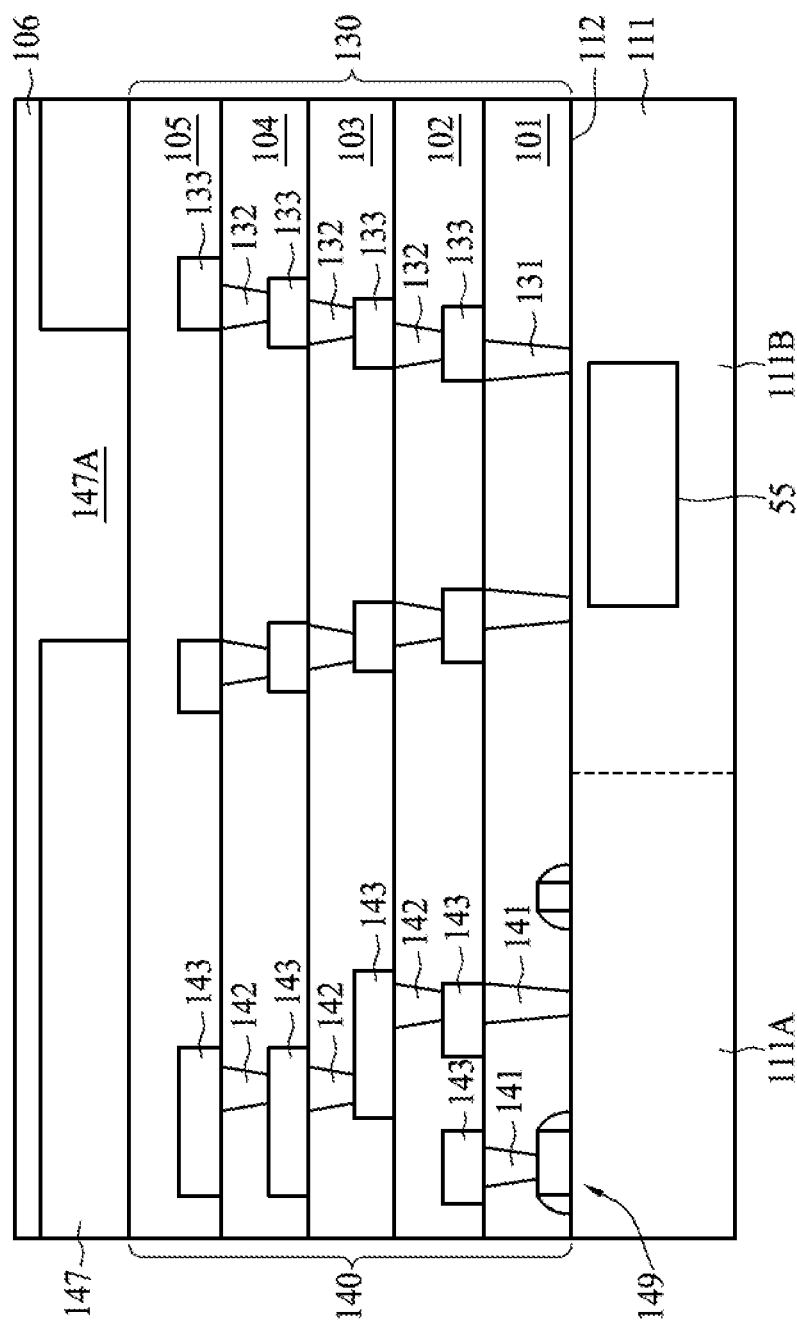

Referring to FIG. 9, the fabrication processes disclosed in FIG. 6, FIG. 7 and FIG. 8 are repeated to form a plurality of inter-metal dielectric layers 103-105 having the second light-guiding parts 132, the electrical vias 142, the third light-guiding part 133, and the electrical metal layer 143. Subsequently, a metal layer 147 having an opening 147A is formed by fabrication processes including deposition, lithographic and etching processes, wherein the opening 147A can be a rectangular opening. The metal layer 147 serves as a light shielding layer, wherein the opening 147A exposes the light sensing region 55 for receiving the light from the sample-holding portion 23, while the metal layer 147 covers the other regions. In addition, the metal layer 147 can serve as a contact pad for forming electrical connection to an external printed circuit board (PCB) by wire bonding. In some embodiment, the thickness of the metal layer 147 is larger than that of the metal layer below, and the thickness of the metal layer 147 is preferably larger than 4,000 angstroms.

Subsequently, dielectric deposition and planarization processes are performed to form a dielectric layer 106 on the metal layer 147 and fills the opening 147A. In some embodiments, the dielectric deposition is a PECVD process, and the planarization is an oxide CMP process. In some embodiments, the dielectric deposition includes a spin-on glass (SOG), SOG curing, SOG etching back, and a PECVD process. In some embodiments, the dielectric layer 106 includes silicon oxide or silicon nitride, and silicon nitride is preferred for absorbing background light having a wavelength of 488 nanometers.

Figure 10:
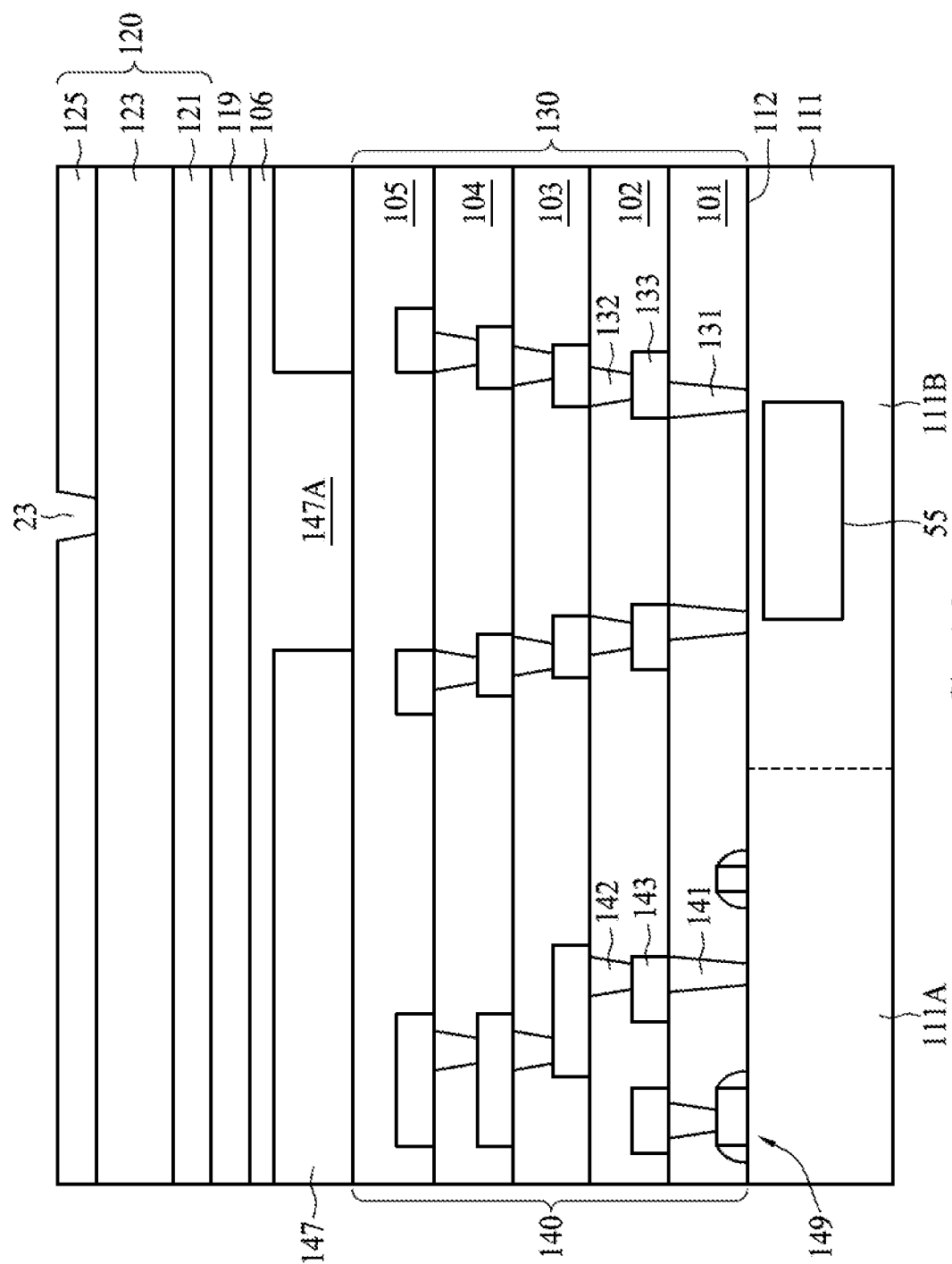

Referring to FIG. 10, a deposition process is performed to form a filter layer 119 over the inter-metal dielectric layer 105. Next, deposition processes are performed to form a lower cladding layer 121 and a core layer 123 over the filter layer 119; subsequently, deposition, lithographic and etching processes are performed to an upper cladding layer 125 having a sample-holding portion 23 over the light sensing region 55. In some embodiments, the refractive index of the core layer 123 is higher than that of the cladding layers 121 and 125.

In some embodiment, the filter layer 119 is transparent to the wavelength emitted from the specimen 231, and the emitting light 81 from the sample-holding portion 23 travels through the filter layer 119 toward the light-sensing region 55. The lower cladding layer 121, the core layer 123, and the upper cladding layer 125 form a waveguide structure 120. In some embodiments, the lower cladding layer 121 and the upper cladding layer 125 include oxide such as SiO2. In some embodiments, the core layer 123 includes dielectric such as Ta2O5 or SiON.

In summary, the embodiment shown in FIG. 5 to FIG. 10 is characterized in integrally forming the light-guiding structure (first light-guiding part, second light-guiding part, third light-guiding part) and the electrical interconnect structure (electrical contact, electrical via, electrical metal layer), i.e., substantially by the same fabrication process and the same material simultaneously, and the corresponding elements of the light-guiding structure and the electrical interconnect structure have substantially the same physical and chemical properties. In addition, integrally forming the light-guiding structure and the electrical interconnect structure not only decreases the fabrication cost, but also simplify the fabrication process.

Figure 11A:
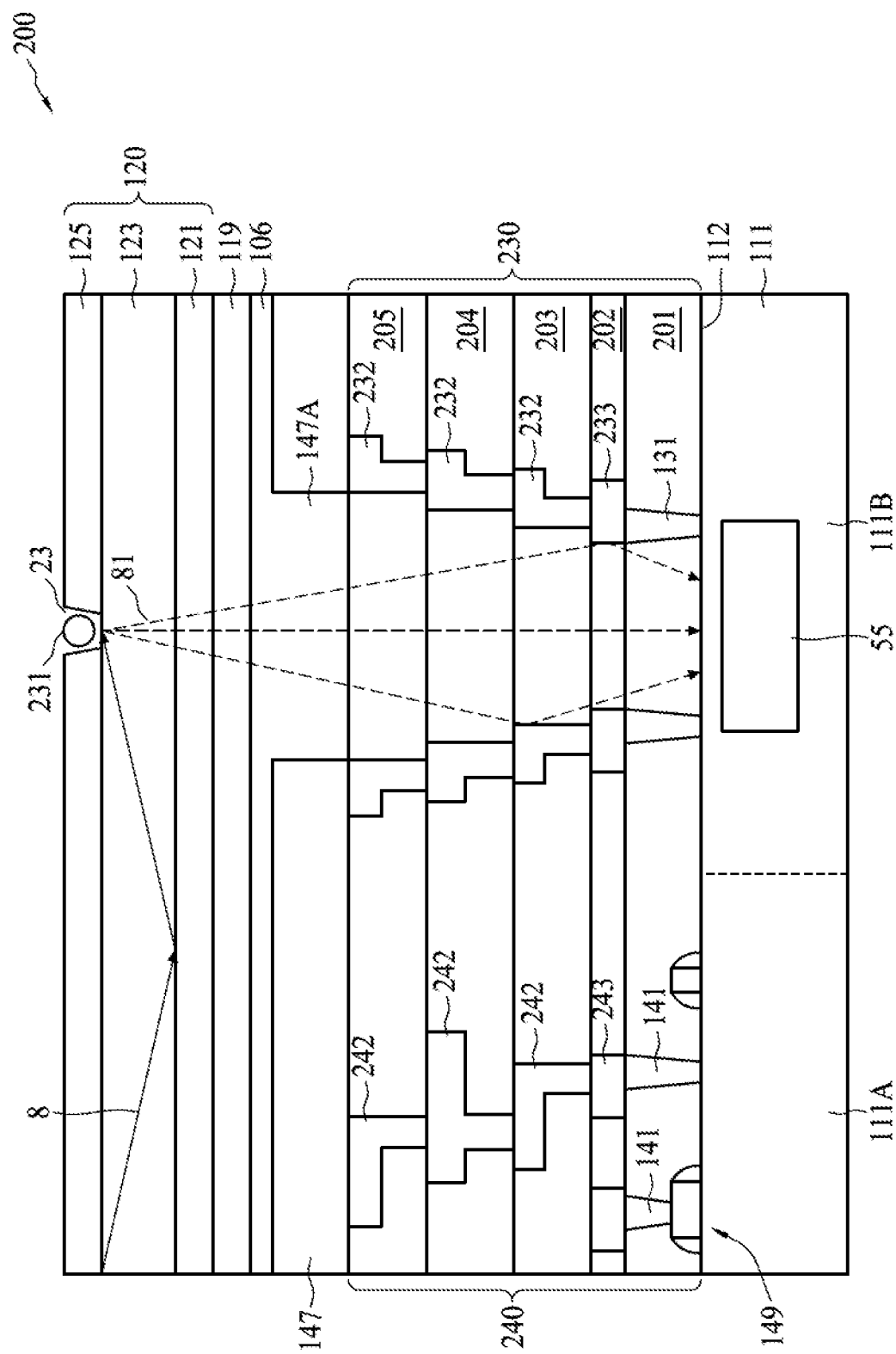
FIG. 11A is a cross-sectional view of an optical sensor in accordance with some embodiments of the present disclosure.

FIG. 11A is a cross-sectional view of an optical sensor 200 in accordance with some embodiments of the present disclosure. In some embodiments, the optical sensor 200 comprises a semiconductive layer 111 comprising an electrical circuit area 111A and an optical sensing area 111B, a sample-holding portion 23 over the optical sensing area 111B, an electrical interconnect structure 240 including at least one electrical contact 141 over the electrical circuit area 111A, and a light-guiding structure 230 including at least one first light-guiding part 131 between the sample-holding portion 23 and the optical sensing area 111A.

In some embodiments, the electrical interconnect structure 240 is integrally formed with the light-guiding structure 230. In some embodiments, the elements of the electrical interconnect structure 240 and the elements of the light-guiding structure 230 are formed substantially by the same fabrication process, and have substantially the same physical and chemical properties.

In some embodiments, the first light-guiding part 131 is simultaneously formed with the electrical contact 141 substantially by the same fabrication process and the same material, and the first light-guiding part 131 and the electrical interconnect contact 141 have substantially the same physical and chemical properties. In some embodiments, the semiconductive layer 111 has a horizontal upper surface 112, the at least one electrical contact 141 and the at least one first light-guiding part 131 extend substantially in a same horizontal plane, which is in parallel to and above the horizontal upper surface 112, and the light-guiding structure 230 is configured to direct an emitting light 81 from the sample-holding portion 23 to the optical sensing area 111A.

In some embodiments, the optical sensor 200 comprises an inter-layer dielectric layer 101 and a plurality of inter-metal dielectric layers 202-205, wherein the inter-layer dielectric layer 101 has the electrical contact 141 and the first light-guiding part 131, while the inter-metal dielectric layers 202-205 have at least one electrical via 242 and at least one electrical metal layer 243 over the electrical circuit area 111A, and at least one second light-guiding part 232 and at least one third light-guiding part 233 over the optical sensing area 111B. In some embodiments, the light-guiding structure 230 can use the ring-shaped layout shown in FIG. 3, the part layout in a ring shown in FIG. 4, or the bar layout shown in FIG. 5.

In some embodiments, the third light-guiding part 233 is simultaneously formed with the electrical metal layer 243 substantially by the same fabrication process and the same material, and the third light-guiding part 233 and the electrical metal layer 243 have substantially the same physical and chemical properties. In some embodiments, the electrical metal layer 243 and the third light-guiding part 233 extend substantially in a same horizontal plane, which is in parallel to and above the horizontal upper surface 112. The upper ends of the electrical metal layer 243 and the third light-guiding part 233 are substantially at the same level, and the bottom ends of the electrical metal layer 243 and the third light-guiding part 233 are substantially at the same level, and they can be formed through the same fabrication processes.

In some embodiments, the second light-guiding part 232 is simultaneously formed with the electrical via 242 substantially by the same fabrication process and the same material, and the second light-guiding part 232 and the electrical via 242 have substantially the same physical and chemical properties. In some embodiments, the electrical via 242 and the second light-guiding part 232 extend substantially in a same horizontal plane, which is in parallel to and above the horizontal upper surface 112. The upper ends of the electrical via 242 and the second light-guiding part 232 are substantially at the same level, and the bottom ends of the electrical via 242 and the second light-guiding part 232 are substantially at the same level, and they can be formed through the same fabrication processes.

In some embodiments, the second light-guiding part 232 can be optionally implemented in some of the dielectric layers, rather than in all of the dielectric layers. In some embodiments, the horizontal distance between the second light-guiding parts 232 in the upper dielectric layer 205 is larger than that in the lower dielectric layer 203; in other words, the horizontal distance shrinks along a light-propagating direction from the sample-holding portion 23 to the light-sensing region 55 in the optical sensing area 111B. In some embodiments, the light-guiding structure 230 extends vertically or in a tilt manner from the horizontal upper surface 112 of the semiconductive layer 111.

In some embodiments, the light-sensing region 55 is electrically connected to the electrical interconnect structure 240 through conductor so as to transfer the charge carriers generated in the light sensing region 55 to the electrical circuitry in the electrical interconnect structure 240 for further signal processing and/or output to signal-processing electronics, such as a DSP or microprocessor.

Figure 11B:
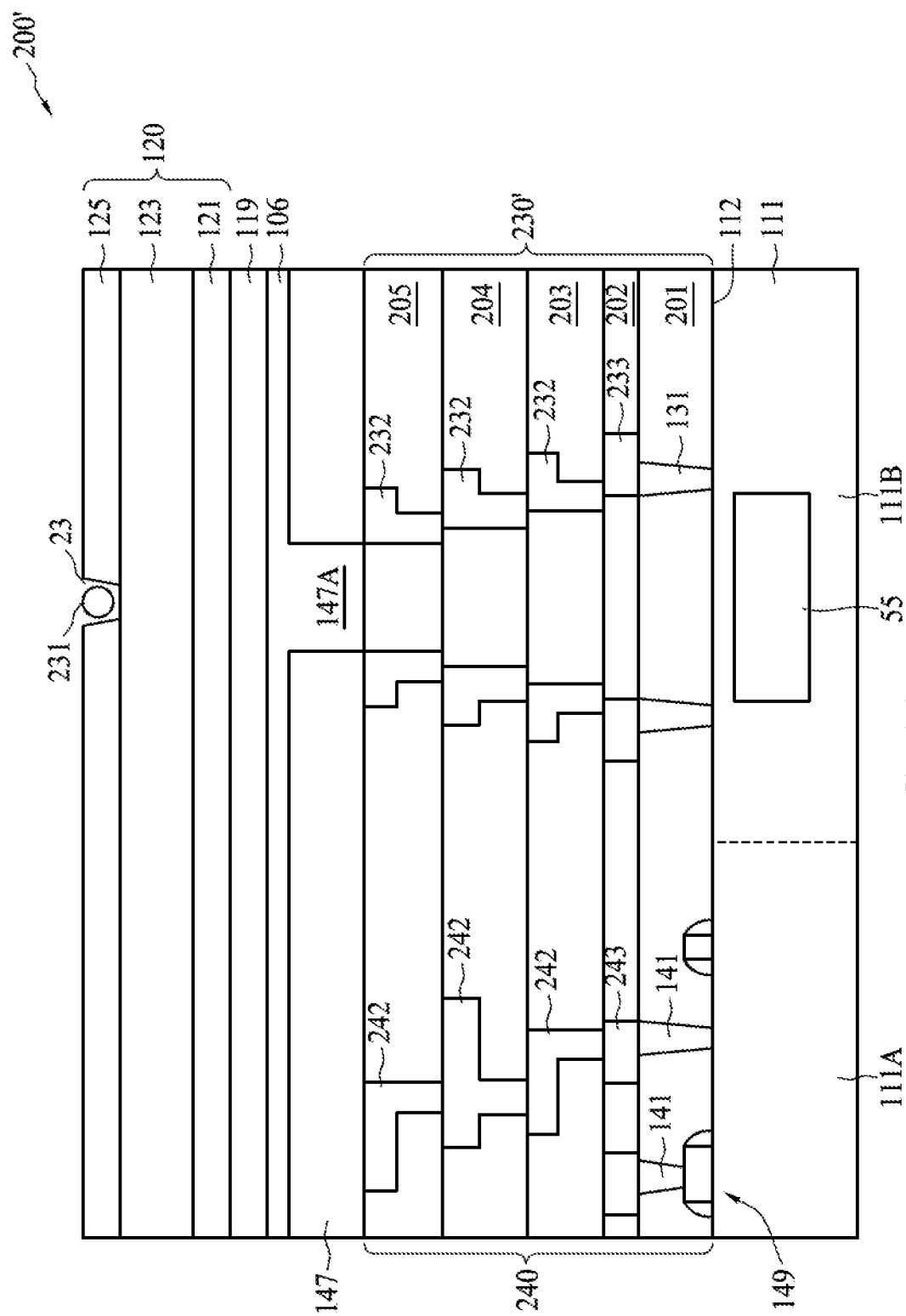
FIG. 11B is a cross-sectional view of an optical sensor in accordance with some embodiments of the present disclosure.

FIG. 11B is a cross-sectional view of an optical sensor 200' in accordance with some embodiments of the present disclosure. The optical sensor 200' shown in FIG. 11B is substantially the same as the optical sensor 200 shown in FIG. 11A, except the design of the light-guiding structure. In FIG. 11A, the width of the light-guiding structure 230 is larger in the upper region (close to the sample-holding portion 23) than that in the bottom region (close to the light-sensing region 55); in contrast, in FIG. 11B, the width of the light-guiding structure 230' is larger in the bottom region (close to the light-sensing region 55) than that in the upper region (close to the sample-holding portion 23).

Figure 11C:
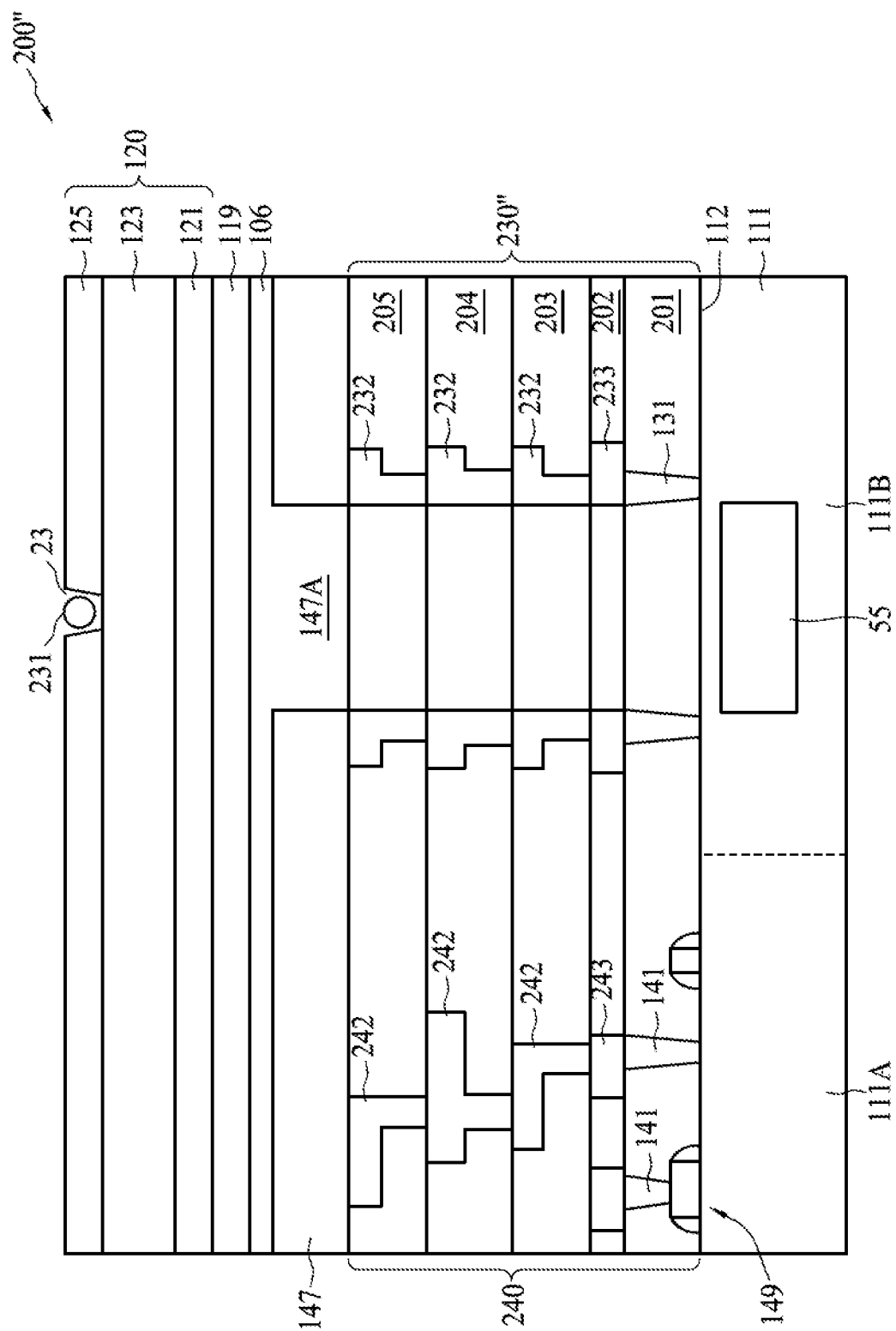
FIG. 11C is a cross-sectional view of an optical sensor in accordance with some embodiments of the present disclosure

FIG. 11C is a cross-sectional view of an optical sensor 200" in accordance with some embodiments of the present disclosure. The optical sensor 200" shown in FIG. 11C is substantially the same as the optical sensor 200 shown in FIG. 11A, except the design of the light-guiding structure. In FIG. 11A, the width of the light-guiding structure 230 is larger in the upper region (close to the sample-holding portion 23) than that in the bottom region (close to the light-sensing region 55); in contrast, in FIG. 11C, the width of the light-guiding structure 230" in the bottom region (close to the light-sensing region 55) is substantially the same as that in the upper region (close to the sample-holding portion 23). In other words, the inner sidewall of the light-guiding structure 230" is substantially vertical to the horizontal upper surface 112.

Due to the design purpose of the light-guiding structure 230 to prevent light scattering, the emitting light 81 from the sample-holding portion 23 can be more efficiently directed to the light-sensing region 55 in the optical sensing area 111B. Furthermore, the fabrication of the light-guiding structure 230, the electrical interconnect structure 240 and the multi junction photodiode of the light-sensing region 55 comply with the back-end-of-line (BEOL) metallization technology, and can be fabricated by the same fabrication process in the same die. In addition, the light-guiding structure 230, the electrical interconnect structure 240, and the multi junction photodiode of the light-sensing region 55 are integrated in the same die by the same fabrication process rather than in two separated devices. Thus, the size of the optical sensor 200 can be dramatically decreased.

FIG. 12 to FIG. 17 are cross-sectional views for preparing an optical sensor in accordance with some embodiments of the present disclosure. In some embodiments, the fabrication processes disclosed in FIG. 12 to FIG. 17 comply with the copper back-end-of-line (BEOL) metallization technology.

Figure 12:
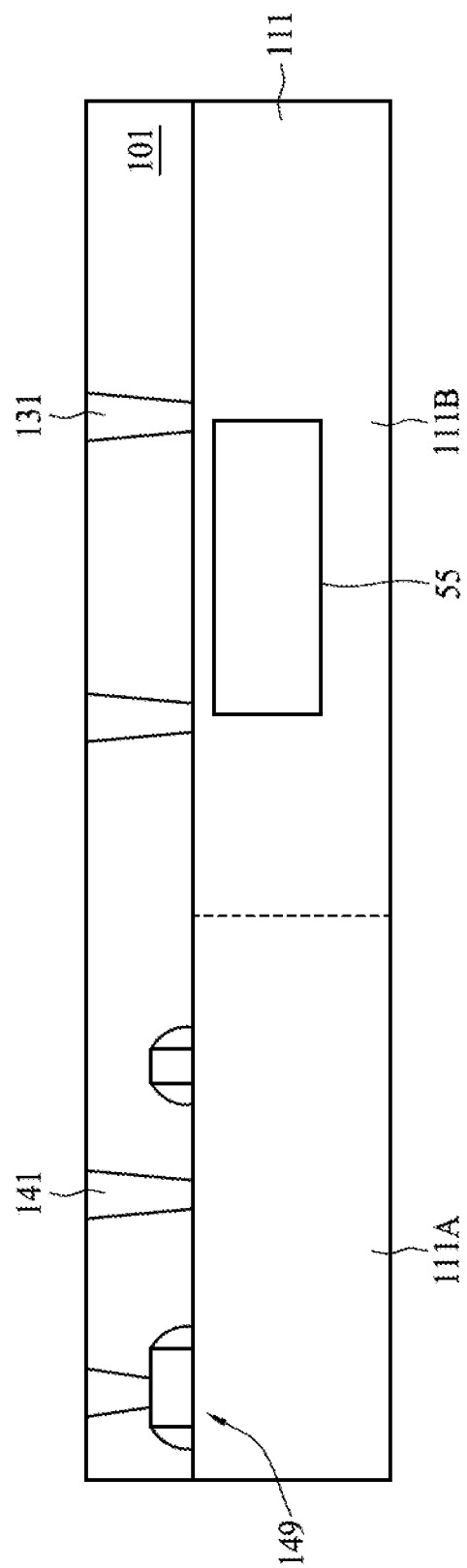
FIG. 12 to FIG. 17 are cross-sectional views for preparing an optical sensor in accordance with some embodiments of the present disclosure.

Referring to FIG. 12, in some embodiments, a light-sensing region 55 is formed in a semiconductive layer 111, electronic devices 149 such as transistors are formed over an electrical circuit area 111A, and an inter-layer dielectric layer 101 is then formed on the semiconductive layer 111 by deposition and planarization processes. Subsequently, lithographic, etching, deposition and planarization processes are performed to form electrical contacts 141 over the electrical circuit area 111A and form first light-guiding parts 131 over the optical sensing area 111B.

Figure 13:
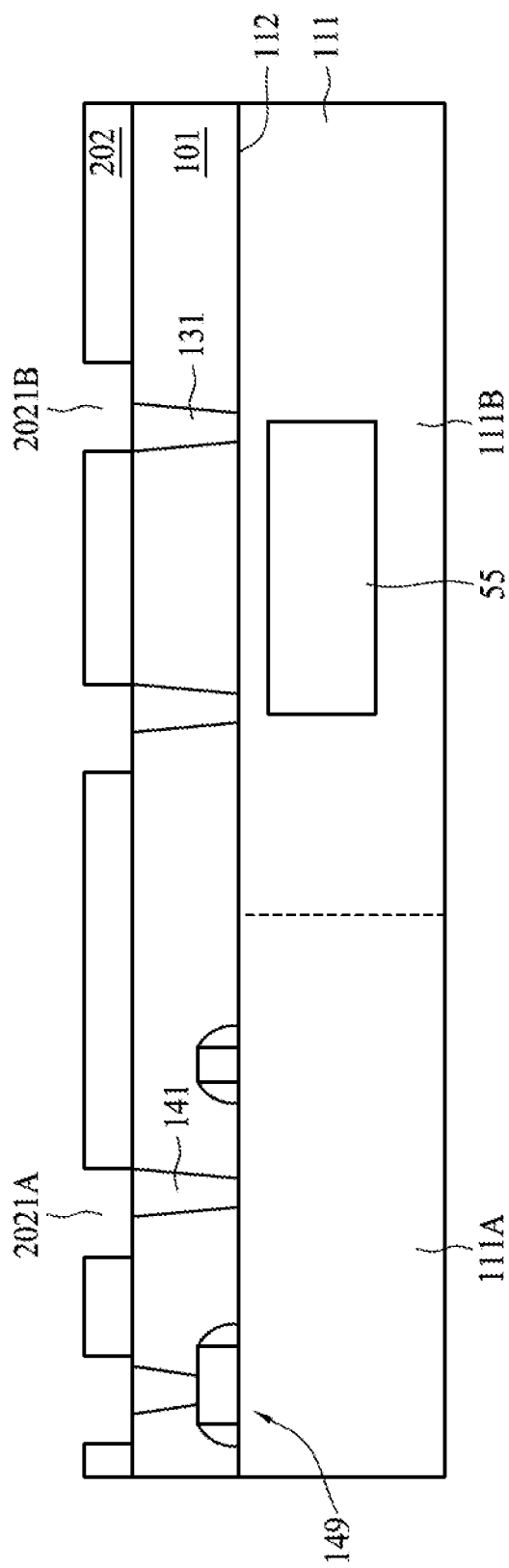

Referring to FIG. 13, deposition, lithographic and etching processes are performed to form an inter-metal dielectric layer 202 having an aperture 2021A and an aperture 2021B, which expose the first light-guiding part 131 over the electrical circuit area 111A and the electrical contact 141 over the optical sensing area 111B.

Figure 14:
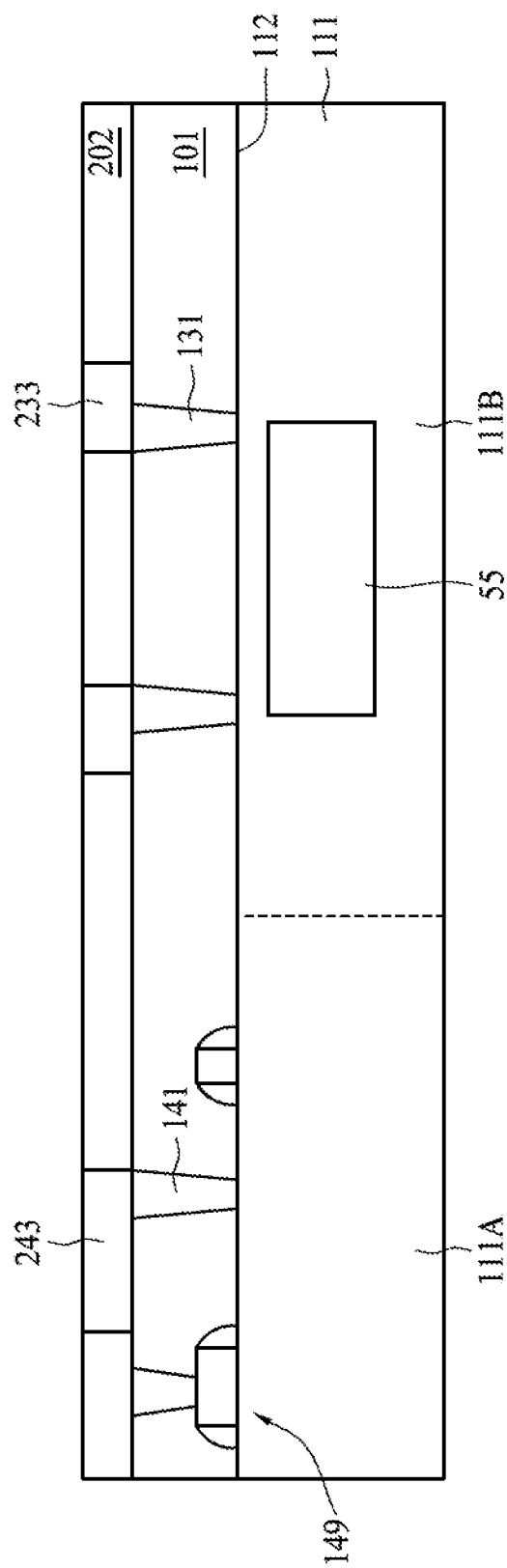

Referring to FIG. 14, deposition and planarization processes are performed to form at least one electrical metal layer 243 in the aperture 2021A over the electrical contact 141 and form at least one third light-guiding part 233 in the aperture 2021B over the first light-guiding part 131. In some embodiments, the electrical metal layer 243 and the third light-guiding part 233 include copper (Cu).

Figure 15:
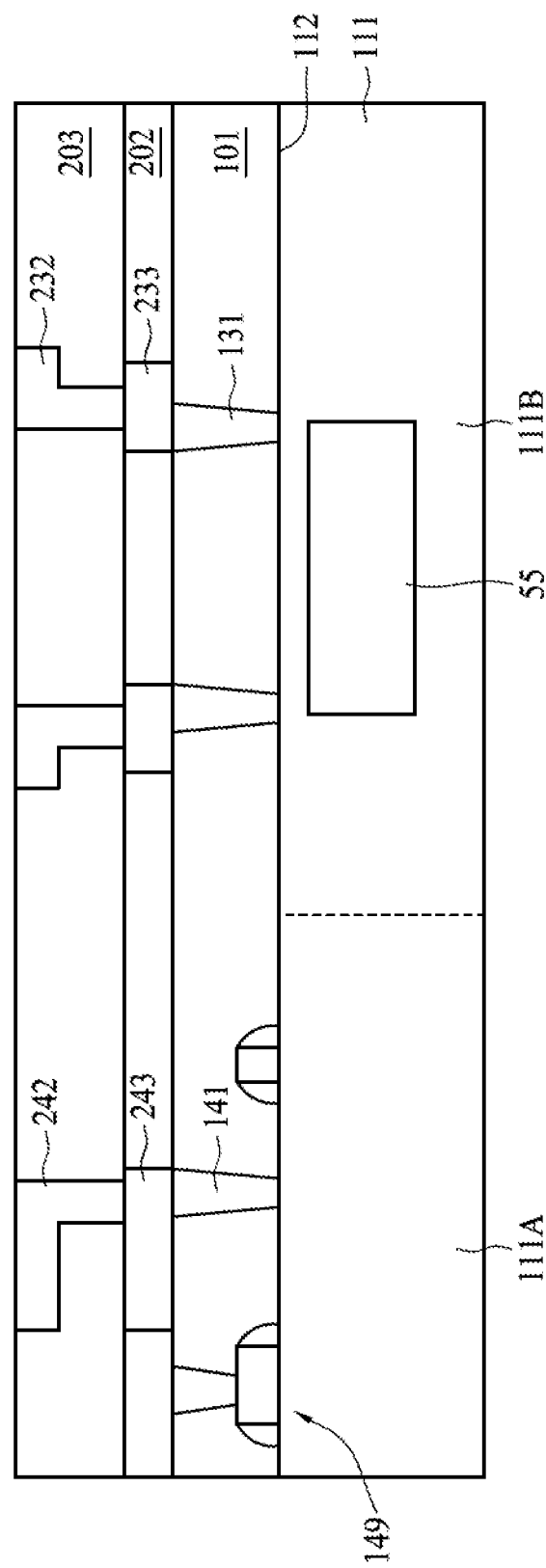

Referring to FIG. 15, deposition, lithographic and etching processes are performed to form an inter-metal dielectric layer 203 over the inter-metal dielectric layer 202. Subsequently, deposition and planarization processes are performed to form an electrical via 242 over the electrical contact 141 and form a second light-guiding part 232 over the first light-guiding part 131. In some embodiments, the electrical metal layer 243 and the third light-guiding part 233 include copper (Cu).

Figure 16:
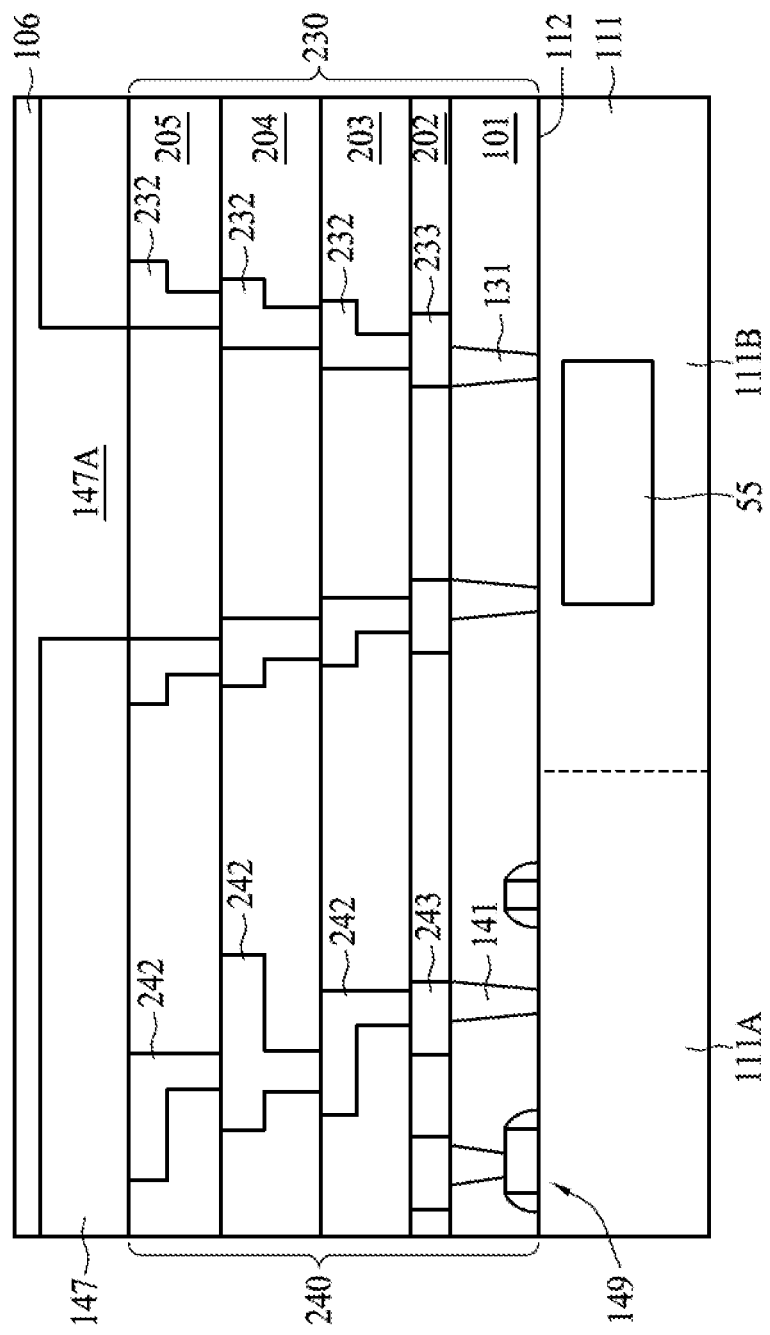

Referring to FIG. 16, the fabrication processes disclosed in FIG. 15 are repeated to form a plurality of inter-metal dielectric layers 204-205, a plurality of second light-guiding parts 232 over the optical sensing area 111B, and a plurality of electrical vias 242 over the electrical circuit area 111A. Subsequently, a metal layer 147 having an opening 147A is formed by fabrication processes including deposition, lithographic and etching processes, wherein the opening 147A can be a rectangular opening. The metal layer 147 serves as a light shielding layer, wherein the opening 147A exposes the light sensing region 55 for receiving the light from the sample-holding portion 23, while the metal layer 147 covers the other regions. In addition, the metal layer 147 can serve as a contact pad for forming electrical connection to an external printed circuit board (PCB) by wire bonding. In some embodiment, the thickness of the metal layer 147 is larger than that of the metal layer below, and the thickness of the metal layer 147 is preferably larger than 4,000 angstroms.

Subsequently, dielectric deposition and planarization processes are performed to form a dielectric layer 106 on the metal layer 147 and fills the opening 147A. In some embodiments, the dielectric deposition is a PECVD process, and the planarization is an oxide CMP process. In some embodiments, the dielectric deposition includes a spin-on glass (SOG), SOG curing, SOG etching back, and a PECVD process. In some embodiments, the dielectric layer 106 includes silicon oxide or silicon nitride, and silicon nitride is preferred for absorbing background light having a wavelength of 488 nanometers.

Figure 17:
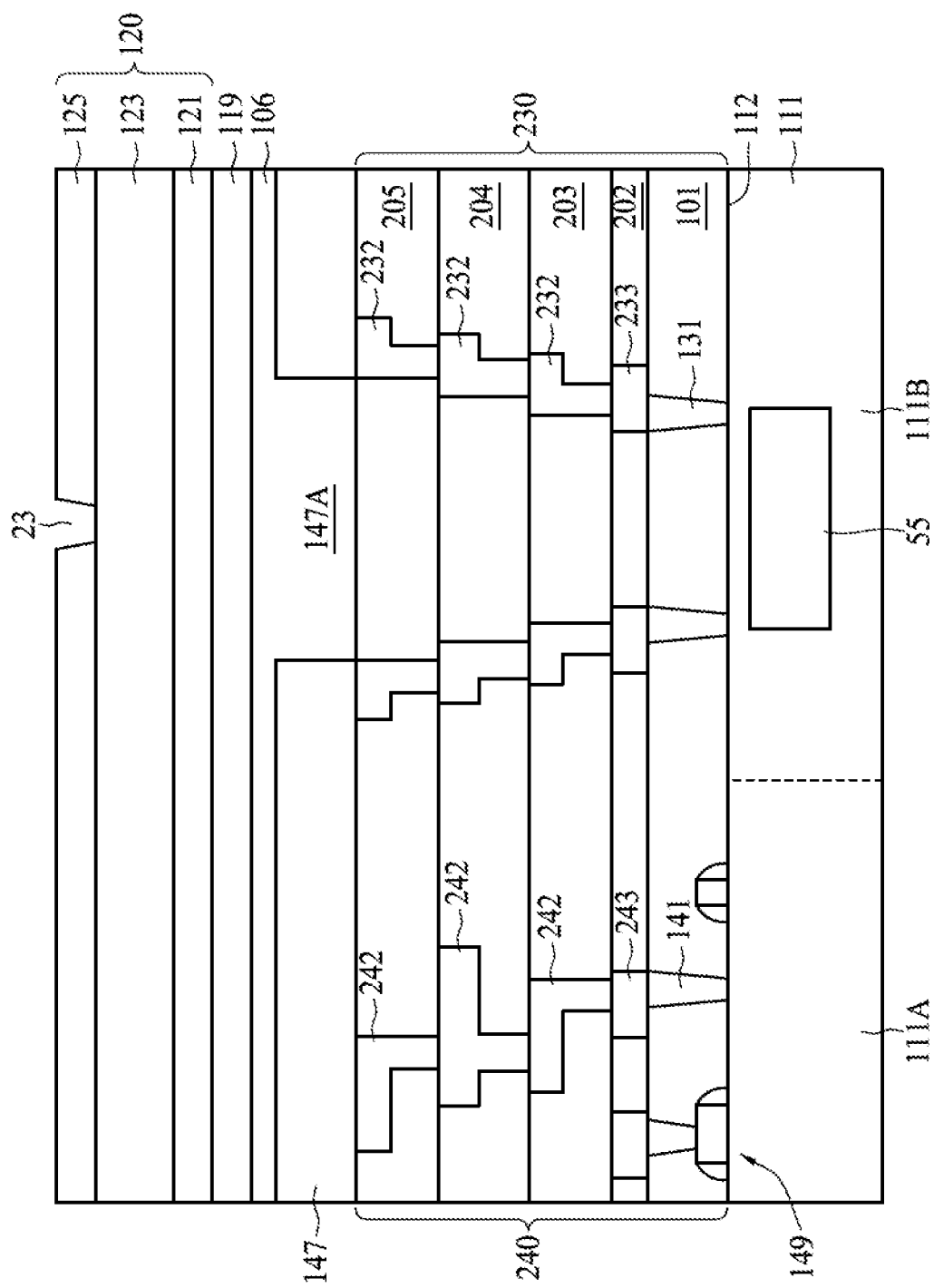

Referring to FIG. 17, a deposition process is performed to form a filter layer 119 over the inter-metal dielectric layer 205. Next, deposition processes are performed to form a lower cladding layer 121 and a core layer 123 over the filter layer 119; subsequently, deposition, lithographic and etching processes are performed to an upper cladding layer 125 having a sample-holding portion 23 over the light sensing region 55.

In some embodiment, the filter layer 119 is transparent to the wavelength emitted from the specimen 231, and the emitting light 81 from the sample-holding portion 23 travels through the filter layer 119 toward the light-sensing region 55. The lower cladding layer 121, the core layer 123, and the upper cladding layer 125 form a waveguide structure 120. In some embodiments, the lower cladding layer 121 and the upper cladding layer 125 include oxide such as $SiO_2$. In some embodiments, the core layer 123 includes dielectric such as $Ta_2O_5$ or SiON.

In summary, the embodiment shown in FIG. 12 to FIG. 17 is characterized in integrally forming the light-guiding structure (first light-guiding part, second light-guiding part, third light-guiding part) and the electrical interconnect structure (electrical contact, electrical via, electrical metal layer), i.e., substantially by the same fabrication process and the same material simultaneously, and the corresponding elements of the light-guiding structure and the electrical interconnect structure have substantially the same physical and chemical properties. In addition, integrally forming the light-guiding structure and the electrical interconnect structure not only decreases the fabrication cost, but also simplify the fabrication process.

Figure 18A:
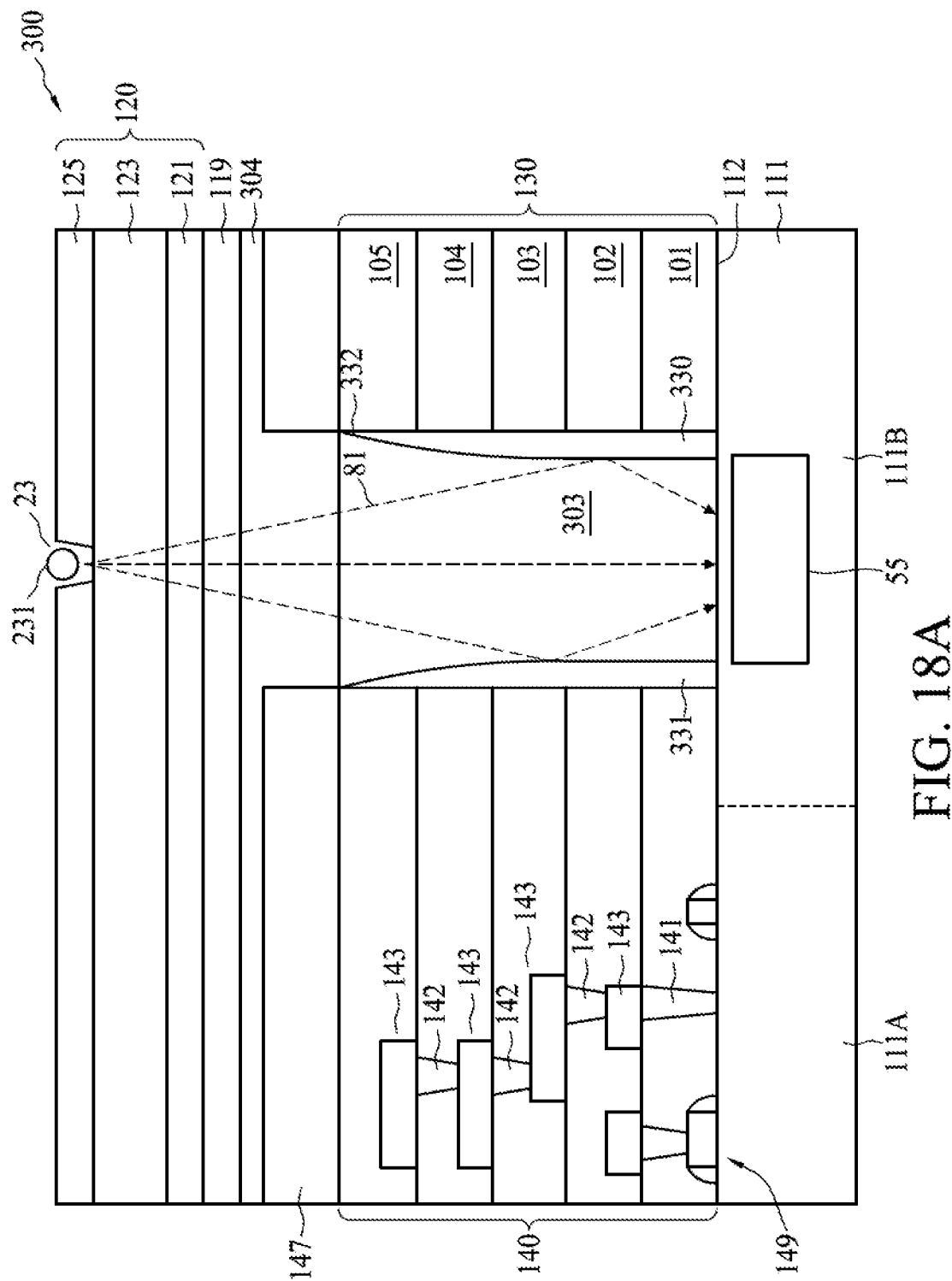
FIG. 18A is a cross-sectional view of an optical sensor in accordance with some embodiments of the present disclosure.

FIG. 18A is a cross-sectional view of an optical sensor 300 in accordance with some embodiments of the present disclosure. In some embodiments, the optical sensor 300 comprises a semiconductive layer 111 having an optical sensing area 111B, a sample-holding portion 23 over the optical sensing area 111B, and a light-guiding structure 330 configured to direct an emitting light 81 from the sample-holding portion 23 to the optical sensing area 111B. The light-guiding structure 330 comprises at least one light-guiding spacer 331 and extends from a horizontal upper surface 112 of the semiconductive layer 111, and the light-guiding structure 330 has a tapering top end 332 near the sample-holding portion 23.

In some embodiments, the optical sensor 100 has a plurality of dielectric layers 101-105 over the optical sensing area 111B, and the light-guiding spacer 331 is a wall extending from the horizontal upper surface 112 of the semiconductive layer 111 through the plurality of dielectric layers 101-105. In some embodiments, the light-guiding spacer 331 can optionally extend vertically or in a tilt manner from the horizontal upper surface 112 through the plurality of dielectric layers 101-105. In some embodiments, the light-guiding structure 330 can use the ring-shaped layout shown in FIG. 3, the part layout in a ring shown in FIG. 4, or the bar layout shown in FIG. 5.

Figure 18B:
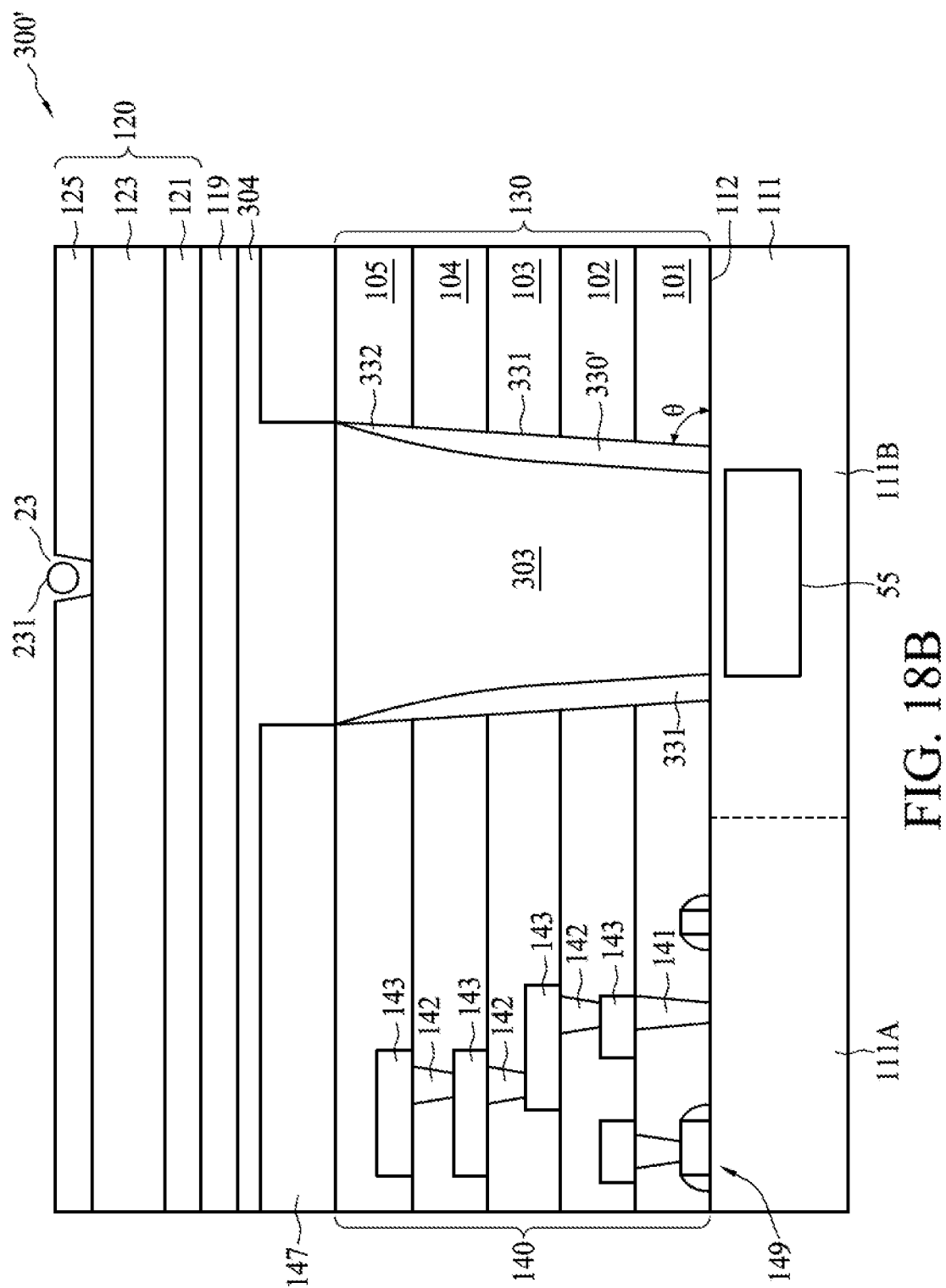
FIG. 18B is a cross-sectional view of an optical sensor in accordance with some embodiments of the present disclosure.

FIG. 18B is a cross-sectional view of an optical sensor 300' in accordance with some embodiments of the present disclosure. The optical sensor 300' shown in FIG. 18B is substantially the same as the optical sensor 300 shown in FIG. 18A, except the design of the light-guiding structure. In FIG. 18B, the sidewall 331 of the light-guiding structure 330' is tilted with respect to the semiconductive layer 111, wherein the included angle (θ) between the horizontal upper surface 112 of the semiconductive layer 111 and the sidewall 331 of the light-guiding structure 330' is about 60 degrees to 89.5 degrees.

Due to the design purpose of the light-guiding structure 330 having a smooth inner sidewall to prevent light scattering, the emitting light 81 from the sample-holding portion 23 can be more efficiently directed to the light-sensing region 55 in the optical sensing area 111B. Furthermore, the fabrication of the light-guiding structure 330 complies with the back-end-of-line (BEOL) metallization technology, and can be fabricated by the same fabrication process in the same die as the electrical interconnected structure 140 and the multi junction photodiode of the light-sensing region 55. In addition, the light-guiding structure 130, the electrical interconnect structure 140 and the multi junction photodiode of the light-sensing region 55 are integrated in the same die by the same fabrication process rather than in two separated devices. Thus, the size of the optical sensor 300 can be dramatically decreased.

FIG. 19 to FIG. 23 are cross-sectional views for preparing an optical sensor in accordance with some embodiments of the present disclosure. In some embodiments, the fabrication processes disclosed in FIG. 19 to FIG. 23 comply with both the aluminum back-end-of-line (BEOL) metallization technology and the copper back-end-of-line (BEOL) metallization technology.

Figure 19:
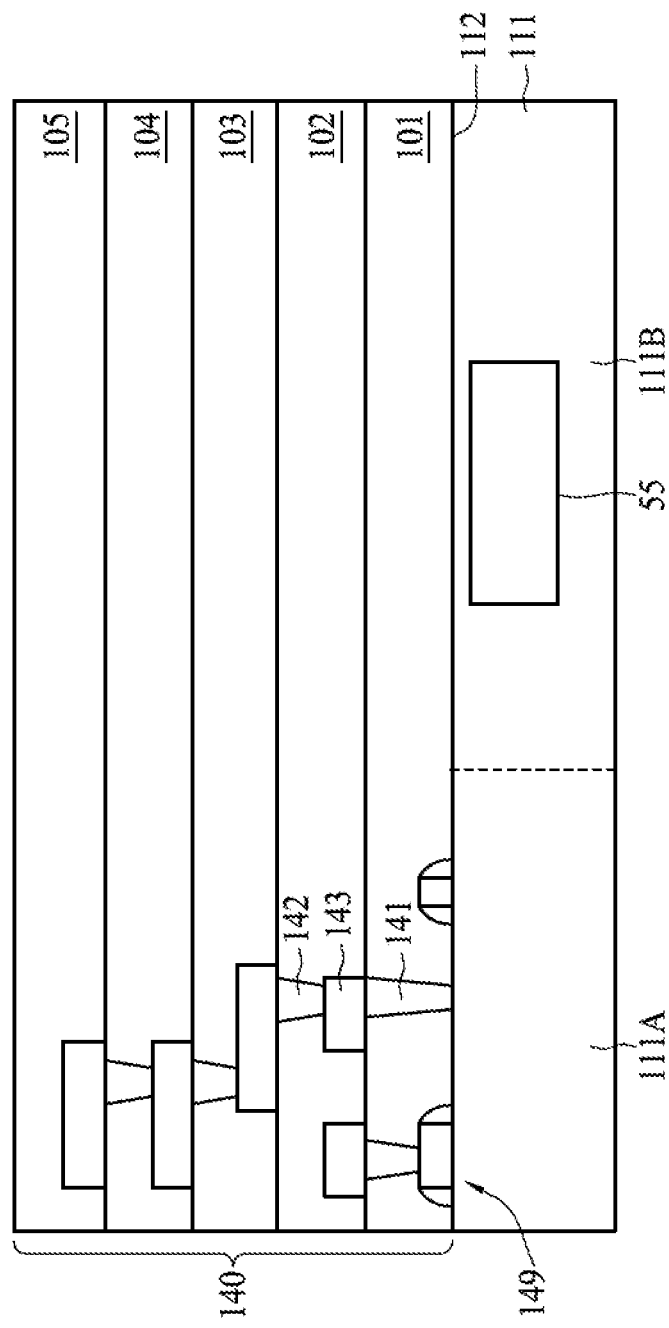
FIG. 19 to FIG. 23 are cross-sectional views for preparing an optical sensor in accordance with some embodiments of the present disclosure.

Referring to FIG. 19, in some embodiments, a light-sensing region 55 is formed in a semiconductive layer 111, and electronic devices 149 such as transistors are formed over an electrical circuit area 111A. Subsequently, lithographic, etching, deposition and planarization processes are performed to form an electrical interconnect structure 140 having electrical contacts 141, electrical metal layers 143, and electrical vias 142 over an electrical circuit area 111A of the semiconductive layer 111.

Figure 20:
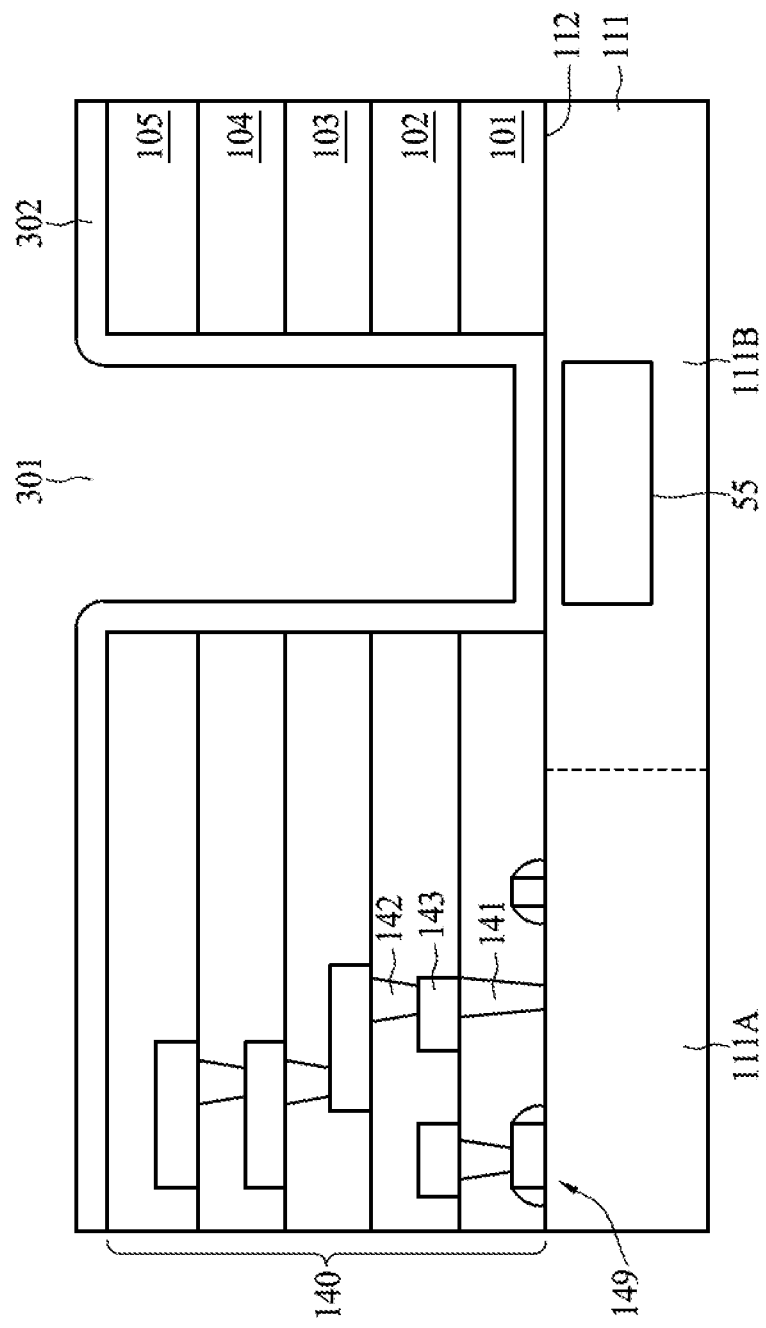

Referring to FIG. 20, lithographic and etching processes are performed to form an aperture 301 over the light-sensing region 55 in the optical sensing area 111B. Subsequently, a metal disposition process is performed to form a metal layer 302 on the sidewall of the aperture 301 and the upper surface of the dielectric layer 105.

Figure 21:
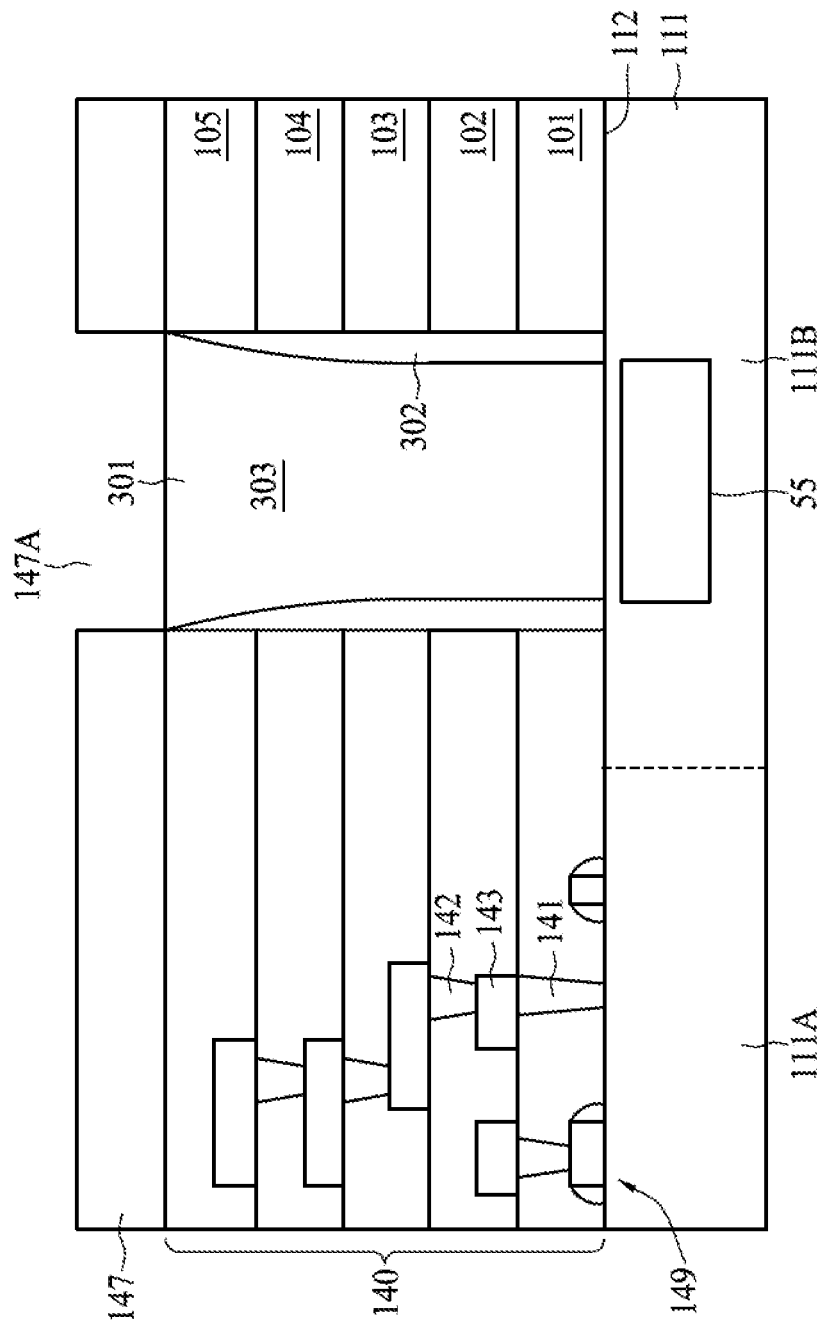

Referring to FIG. 21, a metal etching back process is performed to remove a portion of the metal layer 302 to form a metal spacer on the sidewall of the aperture 301. Subsequently, dielectric deposition and planarization processes are performed to form a dielectric layer 303 filling the aperture 301. In some embodiments, the dielectric layer 303 includes dielectric such as silicon oxide or silicon nitride, and silicon nitride is preferred for absorbing background light having a wavelength of 488 nanometers. Next, a metal layer 147 having an opening 147A is formed by fabrication processes including deposition, lithographic and etching processes, wherein the opening 147A can be a rectangular opening. The metal layer 147 serves as a light shielding layer, wherein the opening 147A exposes the light sensing region 55 for receiving the light from the sample-holding portion 23, while the metal layer 147 covers the other regions. In addition, the metal layer 147 can serve as a contact pad for forming electrical connection to an external printed circuit board (PCB) by wire bonding. In some embodiment, the thickness of the metal layer 147 is larger than that of the metal layer below, and the thickness of the metal layer 147 is preferably larger than 4,000 angstroms.

Figure 22:
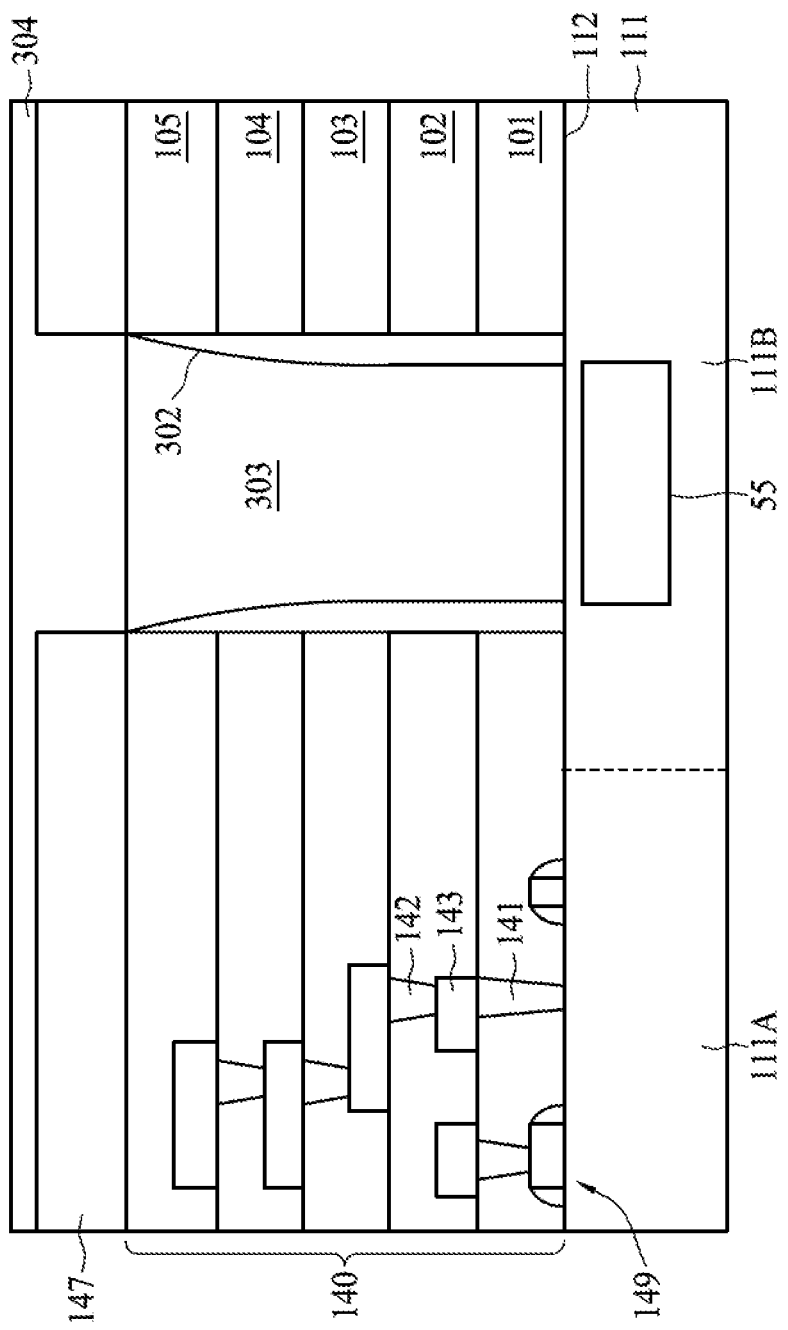

Referring FIG. 22, dielectric deposition and planarization processes are performed to form a dielectric layer 304 on the metal layer 147 and fills the aperture 301 and the opening 147A. In some embodiments, the dielectric deposition is a PECVD process, and the planarization is an oxide CMP process. In some embodiments, the dielectric deposition includes a spin-on glass (SOG), SOG curing, SOG etching back, and a PECVD process. In some embodiments, the dielectric layer 304 includes dielectric such as silicon oxide or silicon nitride, and silicon nitride is preferred for absorbing background light having a wavelength of 488 nanometers.

Figure 23:
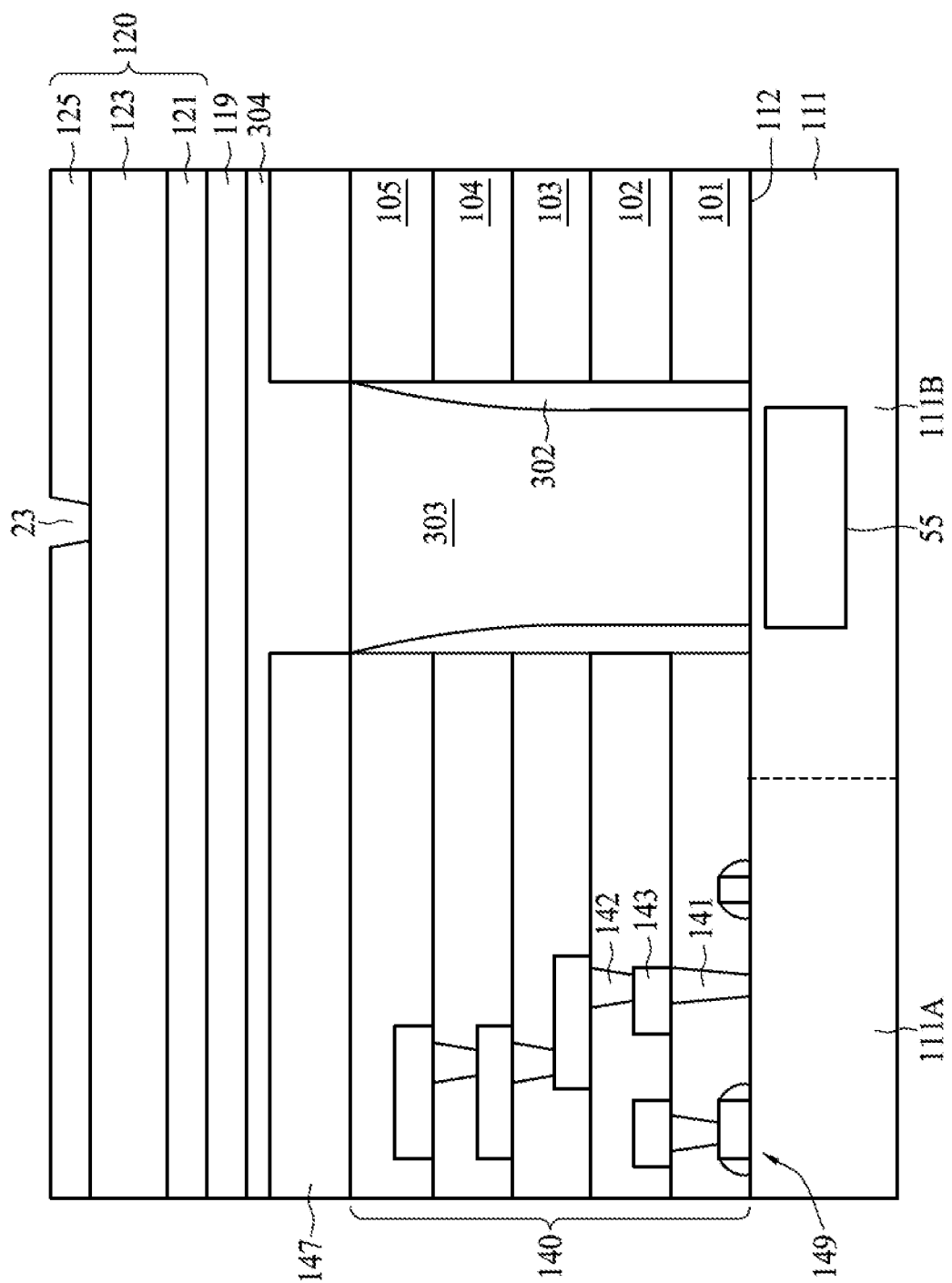

Referring to FIG. 23, a deposition process is performed to form a filter layer 119 over the inter-metal dielectric layer 105. Next, deposition processes are performed to form a lower cladding layer 121 and a core layer 123 over the filter layer 119; subsequently, deposition, lithographic and etching processes are performed to an upper cladding layer 125 having a sample-holding portion 23 over the light sensing region 55.

In some embodiment, the filter layer 119 is transparent to the wavelength emitted from the specimen 231, and the emitting light 81 from the sample-holding portion 23 travels through the filter layer 119 toward the light-sensing region 55. The lower cladding layer 121, the core layer 123, and the upper cladding layer 125 form a waveguide structure 120. In some embodiments, the lower cladding layer 121 and the upper cladding layer 125 include oxide such as $SiO_2$. In some embodiments, the core layer 123 includes dielectric such as $Ta_2O_5$ or SiON.

Some embodiments of the present disclosure provide an optical sensor. The optical sensor includes a semiconductive layer comprising an electrical circuit area and an optical sensing area, a sample-holding portion over the optical sensing area, a light-guiding structure between the sample-holding portion and the optical sensing area, and an electrical interconnect structure over the electrical circuit area. The electrical interconnect structure is integrally formed with the light-guiding structure, and the light-guiding structure is configured to direct an emitting light from the sample-holding portion to the optical sensing area.

Some embodiments of the present disclosure provide an optical sensor. The optical sensor includes a semiconductive layer comprising an electrical circuit area and an optical sensing area, a sample-holding portion over the optical sensing area, at least one electrical contact over the electrical circuit area, and at least one first light-guiding part configured to direct an emitting light from the sample-holding portion to the optical sensing area. The semiconductive layer has a horizontal upper surface, the at least one first light-guiding part is between the sample-holding portion and the optical sensing area, and the at least one electrical contact and the at least one first light-guiding part extend substantially in a same horizontal plane, which is in parallel to and above the horizontal upper surface.

Some embodiments of the present disclosure provide an optical sensor. The optical sensor includes a semiconductive layer comprising an optical sensing area, a sample-holding portion over the optical sensing area, and a light-guiding structure configured to direct an emitting light from the sample-holding portion to the optical sensing area. The light-guiding structure comprises at least one light-guiding spacer and extends from a horizontal upper surface of the semiconductive layer, and the light-guiding structure has a tapering top end near the sample-holding portion.

The light-guiding structure is designed to prevent light scattering. Due to the design of the light-guiding structure, the emitting light from the sample-holding portion can be more efficiently directed to the light-sensing region in the optical sensing area. Furthermore, the fabrication of the light-guiding structure complies with the back-end-of-line (BEOL) metallization technology, and can be fabricated by the same fabrication process in the same die as the electrical interconnected structure and the multi junction photodiode of the light-sensing region. In addition, the light-guiding structure, the electrical interconnect structure and the multi junction photodiode of the light-sensing region are integrated in the same die by the same fabrication process rather than in two separated devices. Thus, the size of the optical sensor can be dramatically decreased.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing an optical sensor, comprising:
    providing a semiconductive layer having an electrical circuit area and an optical sensing area;
    forming an electrical contact directly over the electrical circuit area;
    forming a plurality of metal layers and metal vias over the electrical contact while covering the optical sensing area with intermetal dielectrics;
    forming an aperture in the intermetal dielectric over the optical sensing area; and
    depositing a metal layer conforming to a sidewall of the aperture and over a top surface of the intermetal dielectric;
    etching back the metal layer to obtain a metal spacer only at the sidewall of the aperture;
    depositing dielectric into the aperture and covering the metal layer;
    removing the dielectric from the top surface of the intermetal dielectric;
    forming a thick metal layer on the top surface of the intermetal dielectric; and
    forming an opening aligning with the optical sensing area in the thick metal layer to form a continuous surface from a cross sectional perspective, wherein the continuous surface is composed of a surface of the metal spacer facing the dielectric in aperture and a side of the thick metal layer, and the thick metal layer covers the electrical circuit area.

2. The method of claim 1, further comprising:
    forming a filter layer over and across the electrical circuit area and the optical sensing area;
    forming a waveguide structure over the filter layer; and
    forming a sample-holding portion in the waveguide structure, wherein the waveguide structure is configured to direct a first light having a wavelength of from 450 nm to 500 nm to shine on a sample placed in the sample-holding portion, and the filter layer is configured to absorb a background light having a wavelength of 488 nm.

3. The method of claim 1, wherein forming the aperture in the intermetal dielectric comprises:
    forming a tapered aperture with a tilted sidewall having an inclusive angle of from 60 degrees to 89.5 degrees in the intermetal dielectric.

4. The method of claim 1, wherein forming the plurality of metal layers and metal vias comprises:
    forming copper layers or aluminum layers.

5. The method of claim 1, wherein the side of the thick metal layer is vertically aligned to a surface of the metal spacer in contact with the sidewall of the aperture.

* * * * *